US012663728B2

(12) United States Patent  
Hill et al.

(10) Patent No.: US 12,663,728 B2  
(45) Date of Patent: Jun. 23, 2026

(54) OBLIQUE ILLUMINATION FOR OVERLAY METROLOGY

(71) Applicant: KLA Corporation, Milpitas, CA (US)

(72) Inventors: Andrew V. Hill, Berkeley, CA (US); Yoel Feler, Haifa (IL); Amnon Manassen, Haifa (IL); Mark Ghinovker, Yoqneam Ilit (IL); Yonatan Vaknin, Yoqneam Llit (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/684,179

(22) Filed: Mar. 1, 2022

(65) Prior Publication Data

US 2022/0357674 A1 Nov. 10, 2022

Related U.S. Application Data

(60) Provisional application No. 63/183,651, filed on May 4, 2021.

(51) Int. Cl.
| | |
|---|---|
| *G03F 7/00* | (2006.01) |
| *G01B 11/26* | (2006.01) |

(52) U.S. Cl.
CPC .......... *G03F 7/70633* (2013.01); *G01B 11/26* (2013.01)

(58) Field of Classification Search
CPC .... G01B 11/26; G03F 7/70633; G03F 7/7065
See application file for complete search history.

(56) References Cited

U.S. PATENT DOCUMENTS

| | | | |
|---|---|---|---|
| 11,118,903 B2 | 9/2021 | Hill et al. | |
| 11,800,212 B1 * | 10/2023 | Vaknin | G03F 7/70653 |

(Continued)

FOREIGN PATENT DOCUMENTS

| | | |
|---|---|---|
| CN | 103443900 A | 12/2013 |
| CN | 106471613 A | 3/2017 |

(Continued)

OTHER PUBLICATIONS

International Search Report and Written Opinion in International Application No. PCT/US2022/025155 dated Jul. 26, 2022.

(Continued)

*Primary Examiner* — Peter B Kim  
(74) *Attorney, Agent, or Firm* — Suiter Swantz IP

(57) ABSTRACT

An overlay metrology system may include an overlay metrology tool suitable for measurement of an overlay target on a sample, the overlay target including one or more grating structures with patterned features distributed along one or more measurement directions. The overlay metrology tool may include an objective lens and an illumination pathway to illuminate the overlay target with two or more oblique illumination lobes distributed among one or more illumination distributions such that, for each of the measurement directions, diffraction orders of the one or more illumination distributions by the overlay target that are collected by the objective lens exclusively include a 0-order diffraction lobe and a single first-order diffraction lobe from at least one of the two or more illumination lobes. The overlay metrology tool may further include at least one detector to image the sample and a controller to generate overlay measurements based on the images.

33 Claims, 27 Drawing Sheets

(56) References Cited

U.S. PATENT DOCUMENTS

| | | | |
|---|---|---|---|
| 2011/0043791 A1 | 2/2011 | Smilde et al. | |
| 2012/0210289 A1 | 8/2012 | Hench et al. | |
| 2015/0022822 A1* | 1/2015 | Grunzweig | G03F 7/701 |
| | | | 356/601 |
| 2016/0061750 A1 | 3/2016 | Den Boef et al. | |
| 2016/0123894 A1 | 5/2016 | Fu et al. | |
| 2016/0180517 A1 | 6/2016 | Fuchs et al. | |
| 2016/0209327 A1 | 7/2016 | Grunzweig et al. | |
| 2018/0216930 A1 | 8/2018 | Ur-Rehman | |
| 2018/0335346 A1 | 11/2018 | Hill et al. | |
| 2019/0004220 A1 | 1/2019 | Hsieh et al. | |
| 2019/0271542 A1 | 9/2019 | Shchegrov et al. | |
| 2019/0285407 A1 | 9/2019 | Chuang et al. | |
| 2019/0310080 A1 | 10/2019 | Hill et al. | |
| 2020/0041563 A1* | 2/2020 | Tinnemans | G03F 7/705 |
| 2020/0132446 A1 | 4/2020 | Shalibo et al. | |
| 2020/0209608 A1 | 7/2020 | Beukman et al. | |
| 2021/0103222 A1* | 4/2021 | Clube | G03F 7/70408 |
| 2022/0357674 A1 | 11/2022 | Hill et al. | |
| 2023/0133640 A1* | 5/2023 | Hill | G03F 7/70633 |
| | | | 356/615 |
| 2023/0400782 A1* | 12/2023 | Cappelli | G03F 7/706845 |

FOREIGN PATENT DOCUMENTS

| | | | |
|---|---|---|---|
| CN | 107924132 A | 4/2018 |
| CN | 112041974 A | 12/2020 |
| JP | 2017537317 A | 12/2017 |
| JP | 2018535560 A | 11/2018 |
| JP | 2019507368 A | 3/2019 |
| JP | 2019508721 A | 3/2019 |
| JP | 2019526053 A | 9/2019 |
| JP | 2020507800 A | 3/2020 |
| JP | 2020515028 A | 5/2020 |
| TW | 201710799 A | 3/2017 |
| WO | 2016096524 A1 | 6/2016 |
| WO | 2020046408 A1 | 3/2020 |

OTHER PUBLICATIONS

European Patent Office, Extended European Search Report received in EP Application No. 22799278.1, Jun. 3, 2025, 11 pages.

Taiwan Patent Office, Office Action received in TW Application No. 111116790, May 29, 2025, 46 pages (including translation).

Japanese Patent Office, Office Action received in JP Application No. 2023-557376, Sep. 30, 2025, 10 pages (including translation).

China Patent Office, Chinese Patent Application No. 202280017626.6 dated Mar. 11, 2026, 22 pages (with translation).

* cited by examiner

·············· 1st Order Truncation    ------ 2nd Order Exclusion

1400

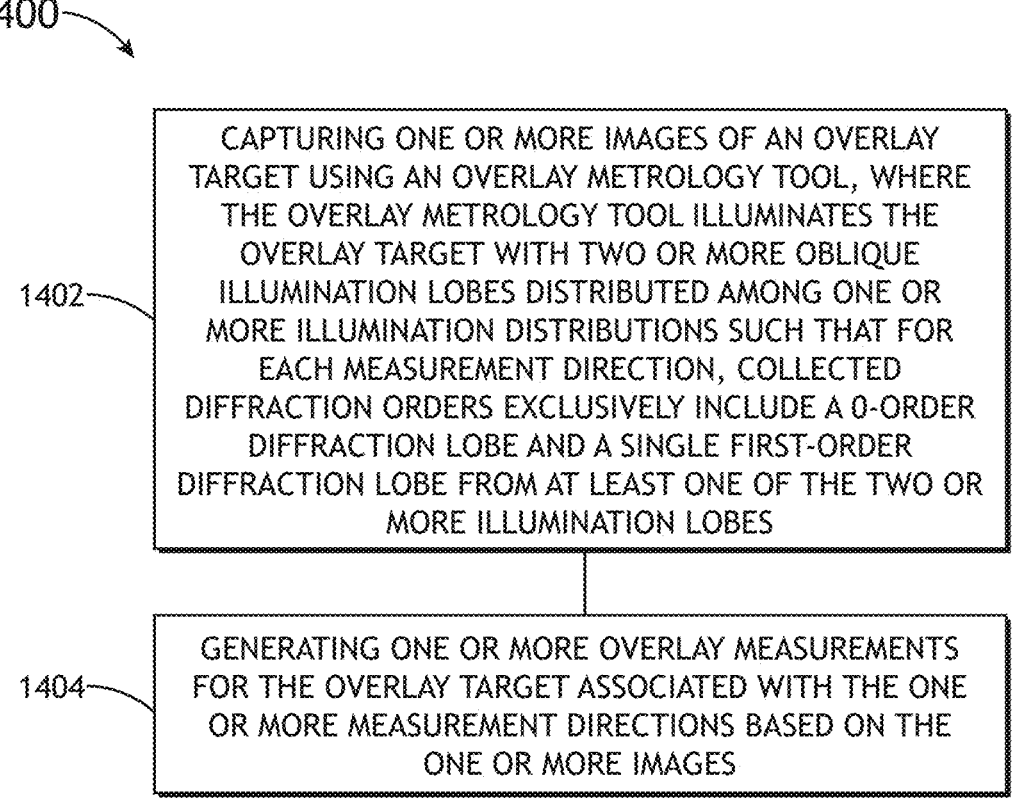

1402 — CAPTURING ONE OR MORE IMAGES OF AN OVERLAY TARGET USING AN OVERLAY METROLOGY TOOL, WHERE THE OVERLAY METROLOGY TOOL ILLUMINATES THE OVERLAY TARGET WITH TWO OR MORE OBLIQUE ILLUMINATION LOBES DISTRIBUTED AMONG ONE OR MORE ILLUMINATION DISTRIBUTIONS SUCH THAT FOR EACH MEASUREMENT DIRECTION, COLLECTED DIFFRACTION ORDERS EXCLUSIVELY INCLUDE A 0-ORDER DIFFRACTION LOBE AND A SINGLE FIRST-ORDER DIFFRACTION LOBE FROM AT LEAST ONE OF THE TWO OR MORE ILLUMINATION LOBES

1404 — GENERATING ONE OR MORE OVERLAY MEASUREMENTS FOR THE OVERLAY TARGET ASSOCIATED WITH THE ONE OR MORE MEASUREMENT DIRECTIONS BASED ON THE ONE OR MORE IMAGES

FIG.14

OBLIQUE ILLUMINATION FOR OVERLAY METROLOGY

CROSS-REFERENCE TO RELATED APPLICATION

The present application claims the benefit under 35 U.S.C. § 119(e) of U.S. Provisional Application Ser. No. 63/183,651, filed May 4, 2021, entitled OBLIQUE ILLUMINATION FOR OVERLAY METROLOGY, which is incorporated herein by reference in the entirety.

TECHNICAL FIELD

The present disclosure relates generally to overlay metrology and, more particularly, to bright-field imaging overlay metrology.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Accordingly, it is desirable to develop systems and methods to address these demands.

SUMMARY

An overlay metrology system is disclosed, in accordance with one or more illustrative embodiments of the present disclosure. In one illustrative embodiment, the system includes an overlay metrology tool to implement a metrology recipe for measurement of an overlay target on a sample, the overlay target associated with the metrology recipe including one or more grating structures with patterned features distributed along one or more measurement directions. In another illustrative embodiment, the overlay metrology tool includes an objective lens and an illumination pathway including one or more illumination optics to illuminate the overlay target with two or more oblique illumination lobes distributed among one or more illumination distributions when implementing the metrology recipe. In another illustrative embodiment, the one or more illumination distributions provide that, for each of the one or more measurement directions, diffraction orders of the one or more illumination distributions by the overlay target that are collected by the objective lens exclusively include a 0-order diffraction lobe and a single first-order diffraction lobe from at least one of the two or more illumination lobes. In another illustrative embodiment, the overlay metrology tool includes a collection pathway including one or more collection optics to image the overlay target on one or more detectors based on light from the overlay target collected by the objective lens in response to the illumination distribution when implementing the metrology recipe. In another illustrative embodiment, the system includes a controller communicatively coupled to at least the one or more detectors. In another illustrative embodiment, the controller receives one or more images of the overlay target from the one or more detectors based on the one or more illumination distributions and generates one or more overlay measurements for the overlay target associated with the one or more measurement directions based on the one or more images.

An overlay metrology system is disclosed, in accordance with one or more illustrative embodiments of the present disclosure. In one illustrative embodiment, the system includes a controller communicatively coupled with an overlay metrology tool, where the overlay metrology tool is configured to implement a metrology recipe for measurement of an overlay target on a sample, and where the overlay target associated with the metrology recipe including one or more grating structures with patterned features distributed along one or more measurement directions. In another illustrative embodiment, the overlay metrology tool includes an objective lens and an illumination pathway including one or more illumination optics to illuminate the overlay target with two or more oblique illumination lobes distributed among one or more illumination distributions when implementing the metrology recipe. In another illustrative embodiment, the one or more illumination distributions provide that, for each of the one or more measurement directions, diffraction orders of the one or more illumination distributions by the overlay target that are collected by the objective lens exclusively include a 0-order diffraction lobe and a single first-order diffraction lobe from at least one of the two or more illumination lobes. In another illustrative embodiment, the overlay metrology tool includes a collection pathway including one or more collection optics to image the overlay target on one or more detectors based on light from the overlay target collected by the objective lens in response to the illumination distribution when implementing the metrology recipe. In another illustrative embodiment, the controller receives one or more images of the overlay target from the one or more detectors based on the one or more illumination distributions and generates one or more overlay measurements for the overlay target associated with the one or more measurement directions based on the one or more images.

An overlay method is disclosed, in accordance with one or more illustrative embodiments of the present disclosure. In one illustrative embodiment, the method includes capturing one or more images of an overlay target using an overlay metrology tool, wherein the overlay metrology tool is configured to implement a metrology recipe for measurement of an overlay target on a sample, the overlay target associated with the metrology recipe including one or more grating structures with patterned features distributed along one or more measurement directions. In another illustrative embodiment, the overlay metrology tool includes an objective lens and an illumination pathway including one or more illumination optics to illuminate the overlay target with two or more oblique illumination lobes distributed among one or more illumination distributions when implementing the metrology recipe. In another illustrative embodiment, the one or more illumination distributions provide that, for each of the one or more measurement directions, diffraction orders of the one or more illumination distributions by the overlay target that are collected by the objective lens exclusively include a 0-order diffraction lobe and a single first-order diffraction lobe from at least one of the two or more illumination lobes. In another illustrative embodiment, the overlay metrology tool further includes a collection pathway including one or more collection optics to image the overlay target on one or more detectors based on light from the overlay target collected by the objective lens in response to the illumination distribution when implementing the metrology recipe. In another illustrative embodiment, the method includes generating one or more overlay measurements for the overlay target associated with the one or more measurement directions based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 14 is a flow diagram illustrating steps performed in a method for overlay metrology based on bright-field imaging with oblique illumination and collection of selected diffraction orders, in accordance with one or more embodiments of the present disclosure.

DETAILED DESCRIPTION

Figure 1A:
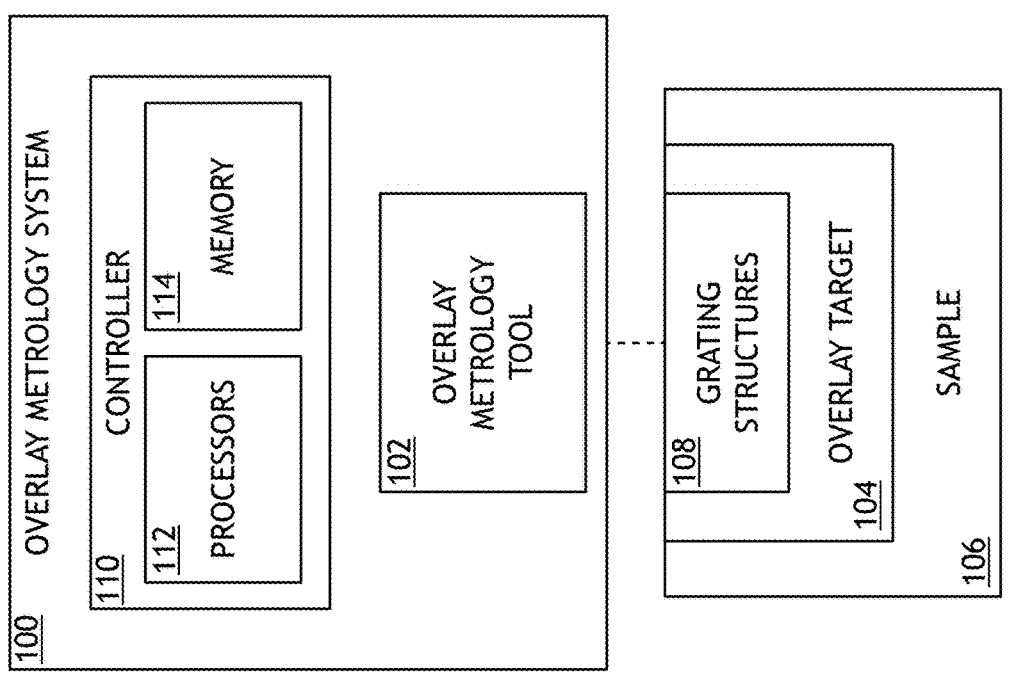
FIG. 1A is a block-diagram of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for overlay metrology based on bright-field imaging of overlay targets with grating features, where the bright-field images are generated using only two diffraction orders from the grating features such as, but not limited to, a zero-order diffraction lobe and a single first-order diffraction lobe (e.g., a +1 order diffraction lobe or a −1 order diffraction lobe). It is contemplated herein that bright-field imaging under these conditions may provide numerous benefits over traditional bright-field imaging (e.g., imaging based on a 0-order diffraction lobe and two or more additional diffraction lobes) such as, but not limited to, increased contrast to provide higher measurement precision, reduced image contrast sensitivity to sample defocus for more relaxed measurement conditions, and the ability to measure overlay targets with finer pitches to support reductions in target size.

For the purposes of the present disclosure, the term overlay is generally used to describe relative positions of features on a sample fabricated by two or more lithographic patterning steps, where the term overlay error describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Further, the term overlay target is used herein broadly to refer to any set of features on a sample having a known periodicity (e.g., corresponding to grating features) suitable for overlay measurements based on bright-field imaging with only two diffraction orders. In some embodiments, an overlay target includes a dedicated target with features on one or more sample layers that are fabricated for the purpose of providing an overlay measurement that is typically representative of overlay of device features on the same layers. For example, a dedicated overlay target may include one or more cells having grating features with characteristics (e.g., grating pitch, feature size, grating orientation, or the like) designed to provide an overlay measurement according to a particular overlay technique. Such dedicated overlay targets may be printed at various locations on a sample including, but not limited to, within scribe lines or within dies. In some embodiments, an overlay target includes device features having known periodicities that are suitable for direct overlay measurements.

It is contemplated herein that an angular distribution of diffraction orders from a grating structure (e.g., a grating structure in an overlay target) is dependent on various characteristics of both the illumination and the grating structure including a pitch of the grating structure, a wavelength of an illumination beam, an incidence angle of the illumination beam (e.g., in azimuth and altitude), and a spatial beam size of the illumination beam. Accordingly, some embodiments of the present disclosure are directed to selecting or otherwise controlling properties of illumination used in an overlay measurement based on properties of an overlay target (or intended overlay target design) in order to achieve a desired angular distribution of diffraction orders from the overlay target. For example, various parameters of illumination directed to a sample may be controlled to provide that selected diffraction orders are collected by collection optics (e.g., within a numerical aperture (NA) of an objective lens, or the like) and are thus available to contribute to an image of the sample or an associated measurement.

In some embodiments, illumination is directed at a sample at an oblique angle such that an objective lens collects only two selected diffraction orders from an overlay target such as, but not limited to, a 0-order diffraction lobe and a single first-order diffraction lobe (e.g., a +1 order diffraction lobe or a −1 order diffraction lobe). It is contemplated herein that imaging based on two selected diffraction orders may provide high-contrast imaging that is robust to sample defocusing errors relative to traditional bright-field imaging techniques. It is further contemplated herein that such oblique illumination may also facilitate imaging of targets having smaller pitches than traditional bright-field imaging systems since the two desired diffraction orders may be spread across a collection pupil.

Some embodiments of the present disclosure are directed to providing recipes for configuring an overlay metrology tool. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, or parameters for controlling one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

Additional embodiments of the present disclosure are directed to illumination profiles providing oblique angles of incidence on a sample to balance performance considerations such as, but not limited to, illumination throughput, spatial coherence of illumination, or illumination wavelength to pitch ratios related to target size. It is contemplated herein that illumination of a sample with relatively larger illumination lobes (e.g., as defined in an illumination pupil) may allow for increased illumination throughput and resultingly brighter images or faster image acquisition, as well as decreased spatial coherence to reduce ringing in image edges. However, illumination of the sample with relatively smaller illumination lobes (e.g., as defined in an illumination pupil) may allow for increased wavelength to pitch ratios (e.g., smaller pitch gratings on an overlay target for a particular illumination wavelength) to facilitate the use of smaller overlay targets. Accordingly, embodiments of the present disclosure are directed to illumination beam shapes and arrangements suitable for balancing such considerations.

Referring now to FIGS. 1-14, systems and methods for high-contrast bright-field imaging for overlay metrology are described in greater detail, in accordance with one or more embodiments of the present disclosure.

FIG. 1A is a block-diagram of an overlay metrology system 100, in accordance with one or more embodiments of the present disclosure. In some embodiments, the overlay metrology system 100 includes an overlay metrology tool 102 configured to generate at least one bright-field image of at least one overlay target 104 on a sample 106 based on two selected diffraction orders from grating structures 108 in the overlay target 104. For example, the overlay metrology tool 102 may implement one or more overlay recipes based on one or more intended designs of an overlay target 104 (e.g., including grating structures 108 with known pitches) such that the selected diffraction orders of interest may be collected and contribute to an image of the overlay target 104.

The sample 106 may include any type of sample known in the art having an overlay target 104 such as, but not limited to, a semiconductor or non-semiconductor material (e.g., a wafer, or the like). In some embodiments, the sample 106 includes a semiconductor or non-semiconductor material such as, but not limited to, monocrystalline silicon, gallium arsenide, and indium phosphide. In some embodiments, the sample 106 includes a bonded sample formed from two substrates bonded together at an interface, where the overlay target 104 is located at or near the interface. These substrates may be formed from any material or combination of materials including, but not limited to, a semiconductor, a metal, a polymer, a glass, or a crystalline material. In some embodiments, at least one of the substrates includes a wafer (e.g., a semiconductor wafer). For example, the sample 106 may be formed as a bonded wafer sample with two wafers bonded at an interface (e.g., in a wafer-to-wafer process). In some embodiments, at least one of the substrates includes a die (e.g., a fabricated die). For example, the sample 106 may be formed as one or more die bonded to a wafer (e.g., in a die-to-wafer process).

The sample 106 may further include a number of layers such as, but not limited to, a resist, a dielectric material, a conductive material, or a semiconductive material. Many different types of such layers are known in the art, and the sample 106 as used herein is intended to encompass a sample on which all types of such layers may be formed. One or more layers formed on the sample 106 may be unpatterned or patterned. For example, patterned features on the sample 106 may include device features on one or more layers, where formation and processing of such layers of material may ultimately result in completed devices. By way of another example, patterned features on the sample 106 may include target features on one or more layers associated with overlay targets 104 (e.g., the grating structures 108, or the like). Further, for the purposes of the present disclosure, the terms sample and wafer should be interpreted as interchangeable.

The overlay metrology tool 102 may include any type of metrology tool known in the art suitable for generating one or more bright-field images of one or more overlay targets 104 on a sample 106 at any plane or combination of planes formed by two selected diffraction orders and further suitable for measuring one or more parameters of interest associated with the sample 106 based on the one or more images.

In some embodiments, the overlay metrology system 100 includes a controller 110 communicatively coupled to the overlay metrology tool 102 or any component therein. In some embodiments, the controller 110 includes one or more processors 112 configured to execute program instructions maintained on memory medium 114, or memory. In this regard, the one or more processors 112 of controller 110 may execute any of the various process steps described throughout the present disclosure. Further, the controller 110 may be communicatively coupled to the overlay metrology tool 102 or any component therein.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FP-GAs), or one or more digital signal processors (DSPs)). In this sense, the one or more processors 112 may include any device configured to execute algorithms and/or instructions (e.g., program instructions stored in memory). In one embodiment, the one or more processors 112 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure.

Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 110 or, alternatively, multiple controllers. Additionally, the controller 110 may include one or more controllers housed in a common housing or within multiple housings. In this way, any controller or combination of controllers may be separately packaged as a module suitable for integration into the overlay metrology system 100.

The memory medium 114 may include any storage medium known in the art suitable for storing program instructions executable by the associated one or more processors 112. For example, the memory medium 114 may include a non-transitory memory medium. By way of another example, the memory medium 114 may include, but is not limited to, a read-only memory (ROM), a random-access memory (RAM), a magnetic or optical memory device (e.g., disk), a magnetic tape, a solid-state drive and the like. It is further noted that memory medium 114 may be housed in a common controller housing with the one or more processors 112. In one embodiment, the memory medium 114 may be located remotely with respect to the physical location of the one or more processors 112 and controller 110. For instance, the one or more processors 112 of controller 110 may access a remote memory (e.g., server), accessible through a network (e.g., internet, intranet and the like).

In this regard, the controller 110 may execute any of the various process steps described throughout the present disclosure. For example, the controller 110 may receive one or more images of the overlay target 104 (e.g., one or more bright-field images) from a detector, generate one or more overlay measurements for the sample 106 based on the one or more images from the detector. By way of another example, the controller 110 may direct or otherwise control (e.g., via control signals) the overlay metrology tool 102, or any component therein. In this way, the controller 110 may direct the overlay metrology tool 102 to perform a measurement based on a particular measurement recipe on a particular design of an overlay target 104.

Figure 1B:
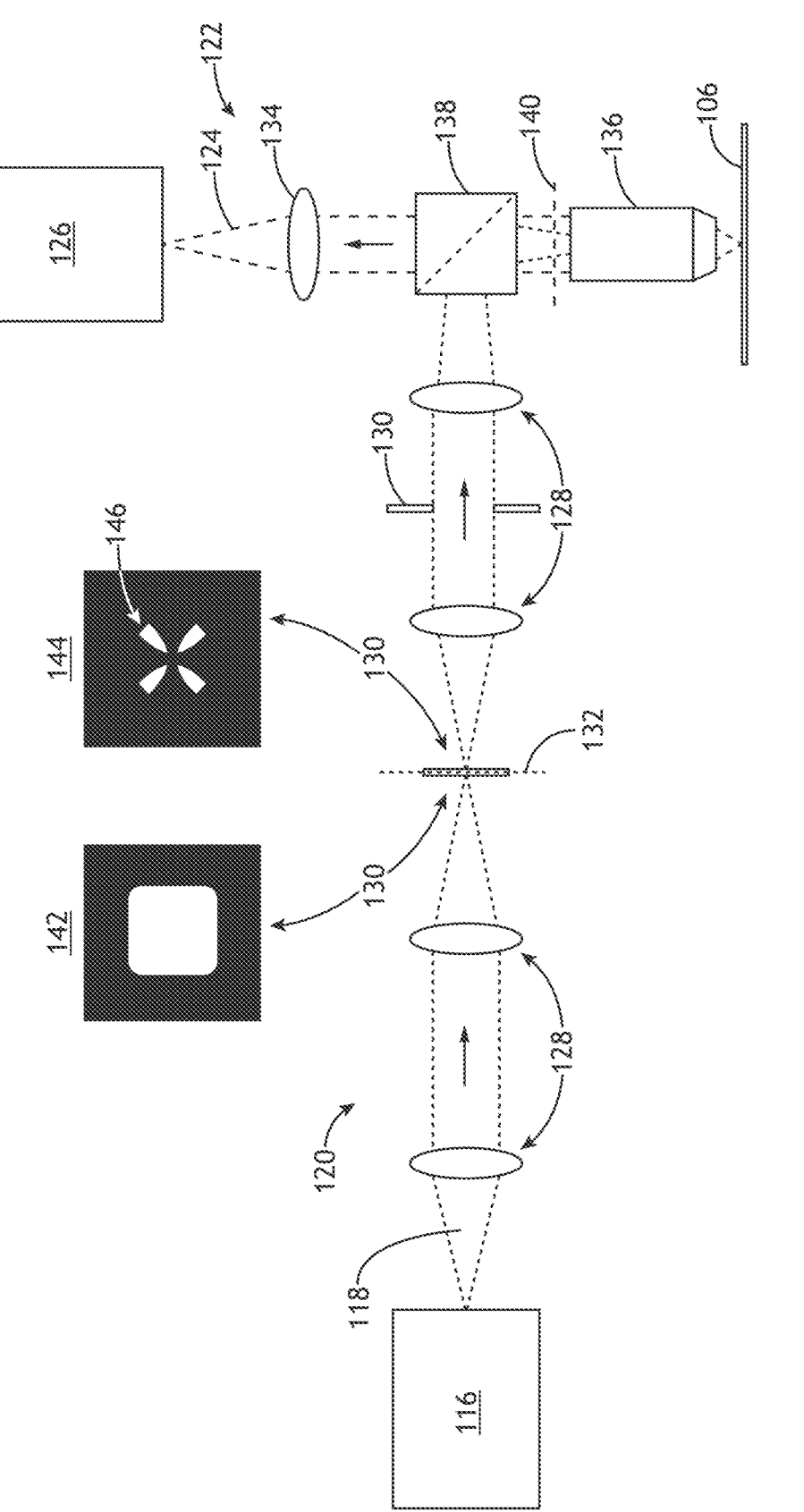
FIG. 1B is a simplified schematic of the overlay metrology tool, in accordance with one or more embodiments of the present disclosure.

FIG. 1B is a simplified schematic of the overlay metrology tool 102, in accordance with one or more embodiments of the present disclosure.

In some embodiments, the overlay metrology tool 102 includes an illumination source 116 configured to generate illumination 118. In some embodiments, the overlay metrology system 100 includes an illumination pathway 120 (e.g., an illumination sub-system) including one or more components to direct the illumination 118 to the sample 106.

In some embodiments, the overlay metrology tool 102 includes a collection pathway 122 (e.g., an imaging subsystem) including one or more components to collect light from the sample 106, referred to herein as sample light 124.

The sample light 124 may include any type of radiation emanating from the sample 106 including, but not limited to, light or particles. For example, the sample light 124 may include reflection and/or diffraction of the illumination 118 by the overlay target 104. In some embodiments, the collection pathway 122 collects a 0-order diffraction lobe (e.g., specular reflection) and a single higher-order diffraction lobe (e.g., a +1 order diffraction lobe, a −1 order diffraction lobe, or the like).

In some embodiments, the overlay metrology tool 102 includes at least one detector 126 configured to receive at least a portion of the sample light 124 from the collection pathway 122 to generate one or more images of the overlay target 104.

The illumination source 116 may include any type of light source known in the art. In some embodiments, the illumination source 116 includes one or more coherent sources such as, but not limited to, one or more laser sources. In this regard, the illumination source 116 may produce an illumination 118 having high coherence (e.g., high spatial coherence and/or temporal coherence). For example, the illumination source 116 may include one or more broadband lasers such as, but not limited to, one or more supercontinuum lasers or white-light lasers. By way of another example, the illumination source 116 may include one or more narrowband lasers. By way of a further example, the illumination source 116 may include one or more tunable lasers to provide an illumination 118 having tunable spectral intensity. Further, a coherent illumination source 116 may be based on any type of technology or product design. For example, the illumination source 116 may include, but are not limited to, any combination of one or more fiber lasers, one or more diode lasers, or one or more gas lasers.

In some embodiments, the illumination source 116 includes one or more low-coherence sources to provide an illumination 118 having low or partial coherence (e.g., spatial and/or temporal coherence). For example, the illumination source 116 may include one or more light emitting diodes (LEDs) or superluminescent LEDs. By way of another example, the illumination source 116 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 116 may include a lamp source such as, but not limited to, an arc lamp, a discharge lamp, an electrode-less lamp, or the like.

Further, the illumination source 116 may include any combination of light sources. In some embodiments, the illumination source 116 includes one or more supercontinuum laser sources to provide broadband illumination and one or more partially-coherent high-brightness LEDs to supplement gaps in the spectrum of the one or more supercontinuum laser sources.

The illumination source 116 may provide illumination 118 having any selected wavelength or range of wavelengths (e.g., spectrum). It is contemplated herein that the spectrum of the illumination 118 may be selected to transmit through at least a portion of the sample 106 to reach the overlay target 104 with minimal or at least acceptable absorption. For example, in the case of a sample 106 formed as two bonded semiconductor substrates, the spectrum of the illumination 118 may be selected to include wavelengths in the infrared spectral range. However, it is to be understood that the systems and methods disclosed herein may be broadly applicable to a wide range of samples such that the illumination 118 may have any selected spectrum based on the composition of the sample 106.

The illumination source 116 may further provide light having any selected temporal characteristics. In some embodiments, the illumination source 116 includes one or more continuous-wave sources to provide a continuous-wave illumination 118. In some embodiments, the illumination source 116 includes one or more pulsed sources to provide a pulsed or otherwise modulated illumination 118.

For example, the illumination source 116 may include one or more mode-locked lasers, one or more Q-switched lasers, or the like.

In some embodiments, the illumination pathway 120 includes one or more illumination lenses 128 to direct the illumination 118 from the illumination source 116 to the sample 106. Additionally, the illumination lenses 128 may be arranged to relay one or more field planes or pupil planes to locations within the illumination pathway 120. The illumination pathway 120 may further include one or more illumination conditioning components 130 suitable for modifying and/or conditioning the illumination 118. The illumination conditioning components 130 may be, but are not required to be, located at field planes and/or pupil planes in the illumination pathway 120. For example, the one or more illumination conditioning components 130 may include, but are not limited to, an illumination aperture stop, an illumination field stop, one or more polarizers, one or more compensators, one or more filters, one or more beam splitters, one or more diffusers, one or more homogenizers, one or more apodizers, one or more beam shapers, one or more mirrors, or one or more lenses.

In some embodiments, the overlay metrology tool 102 (e.g., the illumination source 116 and/or the illumination pathway 120) provides a multi-lobe illumination distribution. For example, the overlay metrology tool 102 may provide illumination 118 in the form of two or more illumination lobes, where the two or more illumination lobes may be directed to the sample 106 either simultaneously or sequentially. Further, any of the illumination lobes in a multi-lobe illumination distribution may be incident on the sample 106 at oblique angles and may thus be referred to as oblique illumination lobes.

FIG. 1B further illustrates an illumination pupil plane 132 at which various components may be placed to manipulate the angular distribution of the illumination 118 on the sample 106. For example, components such as, but not limited to, one or more apertures may be placed at the illumination pupil plane 132 to provide a multi-lobe illumination distribution either simultaneously or sequentially.

In some embodiments, the collection pathway 122 includes one or more collection lenses 134 to collect the sample light 124 from the sample 106 and direct at least a portion of this sample light 124 to at least one detector 126. In some embodiments, the collection pathway 122 includes one or more collection conditioning components (not shown) suitable for modifying and/or conditioning the sample light 124. For example, the one or more collection conditioning components may include, but are not limited to, one or more polarizers, one or more filters, one or more beam splitters, one or more diffusers, one or more apodizers, or one or more beam shapers.

A detector 126 in the overlay metrology tool 102 may include any optical detector known in the art suitable for capturing sample light 124 received from the sample 106. Further, the detector 126 may be suitable for capturing images of a sample 106 that is either stationary or moving. For example, a detector 126 may include, but is not limited to, a photodiode array (PDA), a charge-coupled device (CCD), a complementary metal-oxide semiconductor (CMOS) device, a time-delay integration (TDI) detector, a line-scan detector, a photomultiplier tube (PMT), an avalanche photodiode (APD), or the like. In some embodiments, a detector 126 may include a spectroscopic detector suitable for identifying wavelengths of radiation emanating from the sample 106 and dispersed onto a sensor using a dispersive element.

A detector 126 may be located at any imaging plane of the overlay metrology system 100. For instance, a detector 126 may be located at a plane conjugate to the sample 106 to generate an image of the sample 106. Further, the overlay metrology system 100 may include multiple detectors 126 (e.g. associated with multiple beam paths generated by one or more beamsplitters to facilitate multiple metrology measurements (e.g. multiple metrology tools) by the overlay metrology system 100. In some embodiments, a detector 126 may include a spectroscopic detector suitable for identifying wavelengths of radiation emanating from the sample 106.

In some embodiments, the overlay metrology tool 102 includes an objective lens 136 to direct illumination 118 to the sample 106 and/or capture the sample light 124 from the sample 106. For example, as illustrated in FIG. 1B, the overlay metrology tool 102 may include a beamsplitter 138 common to both the illumination pathway 120 and the collection pathway 122 to allow the objective lens 136 to simultaneously direct illumination 118 to the sample 106 and capture the sample light 124 from the sample 106. In some embodiments, though not shown, the illumination pathway 120 and the collection pathway 122 may include separate lenses to direct the illumination 118 to the sample 106 and collect the sample light 124, respectively.

In some embodiments, the overlay metrology tool 102 includes a sample positioning sub-system configured to adjust the sample 106 and/or the illumination 118 prior, during, and/or after a measurement. For example, FIG. 1B illustrates a sample positioning sub-system includes a translation stage (not shown) to adjust the position of the sample 106 along any dimension such as, but not limited to, a lateral position within the X-Y plane, axially along the Z axis (e.g., an optical axis of the objective lens 136), tip, tilt, or the like. By way of another example, though not shown, the sample positioning sub-system may include one or more scanning optical elements (e.g., galvanometers, rotatable mirrors, or the like) suitable for scanning the illumination 118 across the sample 106, or a portion thereof.

As described previously herein, the overlay metrology tool 102 may be configured according to one or more metrology recipes, which may control various parameters of the overlay metrology tool 102 including, but not limited to, components in the illumination pathway 120, components in the collection pathway 122, the objective lens 136, or the detector 126. In this way, the overlay metrology tool 102 may be configured to provide only two selected diffraction lobes by a known overlay target 104 (or target design) in a collection pupil plane 140 in response to the illumination 118. For example, the metrology recipe may provide that only the two selected diffraction lobes are collected by the objective lens 136.

Figure 2:
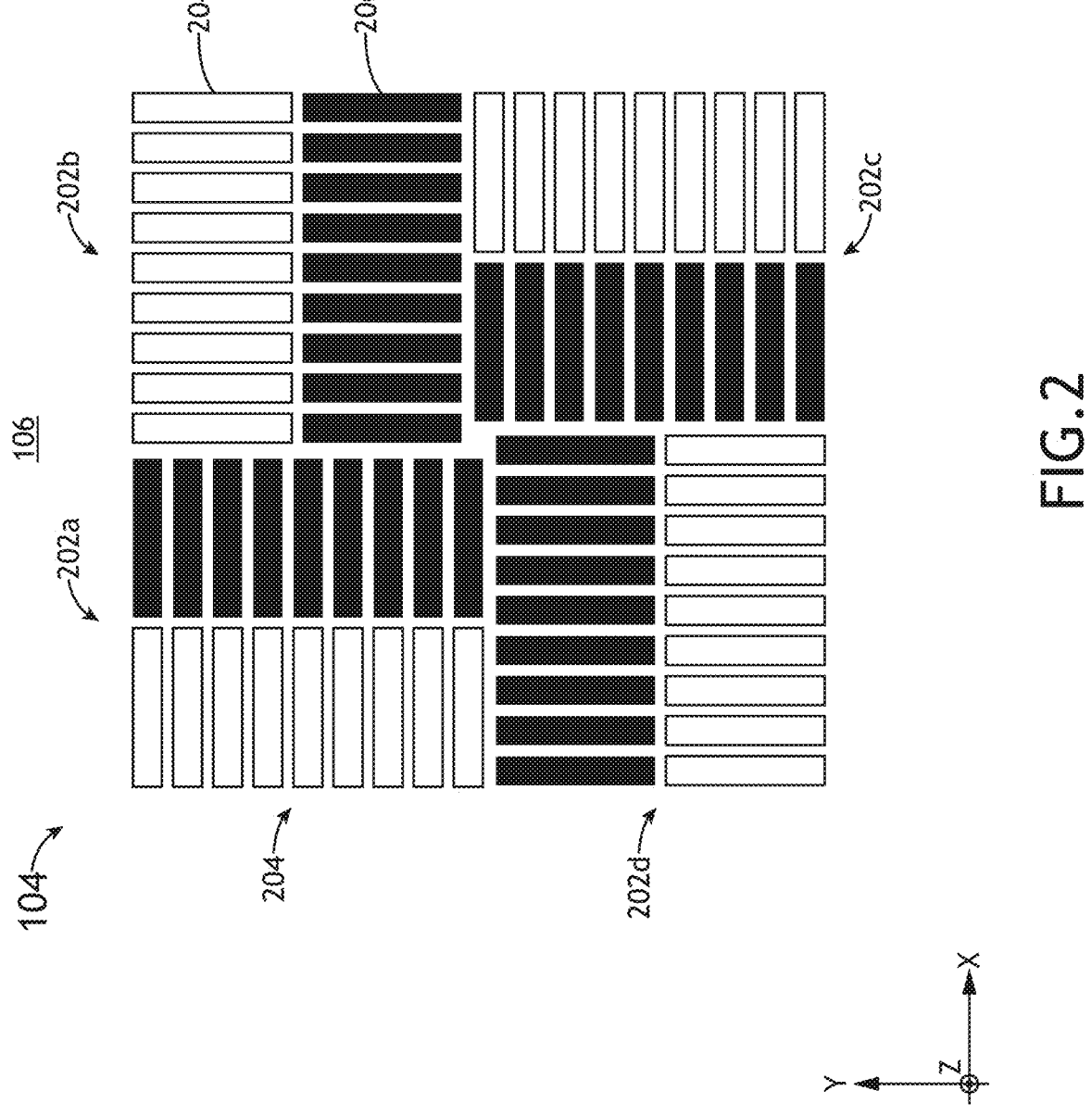
FIG. 2 is a top view of an overlay target with non-overlapping features, in accordance with one or more embodiments of the present disclosure.

Referring now to FIGS. 2-14, bright-field imaging based on two selected diffraction orders (e.g., two selected diffraction lobes) is described in greater detail, in accordance with one or more embodiments of the present disclosure. FIG. 2 depicts a non-limiting example of an overlay target 104 with non-overlapping grating structures 108 suitable for measurements along two orthogonal directions.

The overlay metrology tool 102 may generally be suitable for characterizing any type of overlay target 104 having any design. In particular, various components of the overlay metrology tool 102 such as, but not limited to, the illumination pathway 120, the collection pathway 122, or the detectors 126, may be adjusted in accordance with an overlay recipe based on the particular design of the overlay target 104 to be measured. In some embodiments, an overlay target 104 includes periodic features on at least one sample layer that diffract the incident illumination 118. Accordingly, the sample light 124 collected by objective lens 136 may include selected diffraction orders from the overlay target 104.

FIG. 2 is a top view of an overlay target 104 with non-overlapping features, in accordance with one or more embodiments of the present disclosure. In one embodiment, the overlay target 104 includes four cells 202*a-d,* represented here as quadrants of the overlay target 104. Each cell 202*a-d* may include first-layer grating structures 204 (e.g., grating structures 108) located on a first layer of the sample 106 and second-layer grating structures 206 (e.g., grating structures 108) located on a second layer of the sample 106.

As illustrated in FIG. 2, each cell 202 may include grating structures 108 having periodicity (e.g., a known pitch) along a measurement direction. For example, cell 202*b* and cell 202*d* may be configured to provide overlay measurements along the X direction as illustrated in FIG. 2. An overlay measurement along the X direction may be made by directly comparing relative positions of the first-layer grating structures 204 and the second-layer grating structures 206 within each cell or between cell 202*b* and cell 202*d.* In another instance, an overlay measurement along the X direction may be made by comparing a point of rotational symmetry (e.g., rotational symmetry, reflection symmetry, mirror symmetry, or the like) between first-layer grating structures 204 distributed across cell 202*b* and cell 202*d* with a point of symmetry between second-layer grating structures 206 distributed across cell 202*b* and cell 202*d.* Similarly, cell 202*a* and cell 202*c* may be configured to provide overlay measurements along the Y direction as illustrated in FIG. 2.

It is to be understood, however, that FIG. 2 and the associated description is provided solely for illustrative purposes and should not be interpreted as limiting on the present disclosure. For example, an overlay target 104 may generally include any number of cells 202 that are distributed in any configuration suitable for measurements along one or more directions. By way of another example, the grating structures 108 within any cell 202 are not limited to identical features distributed with a single pitch. In some embodiments, the grating structures 108 are formed as a set of elements with two or more characteristic pitches. Such a structure may be functionally decomposed into two or more gratings with different pitches in a common area or layer on a sample 106. In some embodiments, the grating structures 108 include sub-resolution features suitable for controlling the fabrication process. Further, the overlay target 104 may generally include any overlay target known in the art including, but not limited to, an advanced imaging metrology (AIM) target, a robust AIM target, or a triple AIM target. Additionally, the overlay target 104 may include grating structures 108 on one or more sample layers and is thus not limited to multi-layer configurations as illustrated in FIG. 2. In some embodiments, all grating structures 108 are on a common layer to provide overlay between lithographic exposures on that layer (e.g., as a part of a double printing process).

Referring now to FIGS. 3A-8C various non-limiting illumination pupil distributions suitable for bright-field imaging based on two selected diffraction orders from oblique illumination are described, in accordance with one or more embodiments of the present disclosure.

In some embodiments, an illumination pupil distribution (e.g., a distribution of illumination 118 in an illumination pupil plane 132) is selected to provide that only two diffraction lobes for each measurement direction are within a collection NA of the objective lens 136 and thus contribute to a bright-field image. For example, each illumination lobe in an illumination pupil distribution may be selected to be incident on the sample at an oblique angle such that only a 0-order diffraction lobe and a single first-order diffraction lobe (e.g., a +1 diffraction lobe or a −1 diffraction lobe) from grating structures 108 along one or more measurement directions are captured and contribute to a bright-field image.

In some embodiments, the illumination pupil distribution is further configured to provide that the two selected diffraction orders that contribute to image formation (e.g., the 0-order diffraction lobe and a single first-order diffraction lobe) are fully captured by the collection pathway 122 and are thus not truncated in a collection pupil plane 140. It is contemplated herein that bright-field imaging with two non-truncated diffraction orders may further provide high-contrast images and correspondingly sensitive measurements based on these images.

In some embodiments, the illumination pupil distribution includes one or more pairs of illumination lobes, where the illumination lobes in each pair are symmetrically distributed in the illumination pupil plane 132. In this configuration, only the 0-order diffraction lobe and a single first-order diffraction lobe associated with diffraction of each illumination lobe are captured. It is contemplated herein that imaging based on the pairs of symmetric illumination lobes may be robust to asymmetries of the grating structures 108 and/or the overlay metrology tool 102. The two illumination lobes in any given pair may be incident on the sample 106 simultaneously or sequentially. Accordingly, a final image used for an overlay measurement may be based on one or more acquired images depending on the number of illumination configurations.

For example, and as will be shown in greater detail below, the illumination pupil distribution may be formed as, but not limited to, a dipole distribution oriented along a measurement direction, a quadrupole distribution formed as two orthogonal dipoles oriented along two orthogonal measurement directions, a rotated dipole distribution angled with respect to each measurement direction, or a rotated quadrupole distribution angled with respect to each measurement direction.

It is contemplated herein that there is a performance tradeoff associated with a size of a particular illumination lobe. For example, larger illumination lobes pass relatively more illumination 118 and may thus generate relatively brighter images, which supports faster measurements and increased throughput. Larger illumination lobes (e.g., as defined in an illumination pupil plane 132) further decrease spatial coherence during imaging, which reduces ringing in image edges. However, smaller illumination lobes increase the maximum ratio of wavelength of the illumination 118 to the pitch of the grating structures 108 in an overlay target 104 that may be imaged. In this way, relatively smaller illumination lobes (e.g., as defined in an illumination pupil plane 132) may facilitate imaging of relatively smaller pitches for a particular illumination wavelength and thus reducing a required size of an overlay target 104 on the sample 106. Accordingly, different performance tradeoffs may be achieved by varying the shape, size, and position of a particular illumination lobe (e.g., as depicted in an illumination pupil plane 132).

Figure 3C:
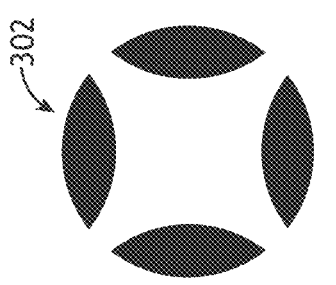
FIG. 3C is an illumination pupil distribution with illumination lobes shaped as geometric lenses (cat's eye shaped), in accordance with one or more embodiments of the present disclosure.
Figure 3C:
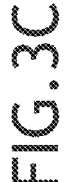
Figure 3B:
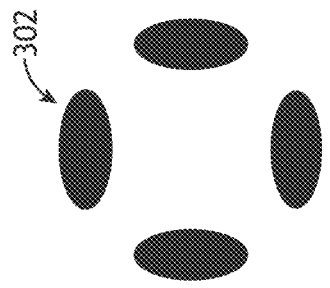
FIG. 3B is an illumination pupil distribution with illumination lobes having elliptical shapes, in accordance with one or more embodiments of the present disclosure.
Figure 3A:
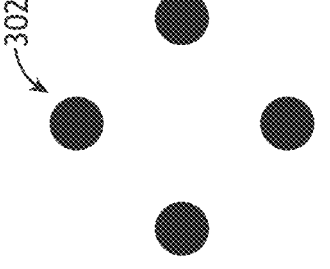
FIG. 3A is an illumination pupil distribution with illumination lobes having circular shapes, in accordance with one or more embodiments of the present disclosure.

FIGS. 3A-3C illustrate three non-limiting examples of illumination pupil distributions with different illumination lobe shapes. FIG. 3A is an illumination pupil distribution with illumination lobes 302 having circular shapes, in accordance with one or more embodiments of the present disclosure. FIG. 3B is an illumination pupil distribution with illumination lobes 302 having elliptical shapes, in accordance with one or more embodiments of the present disclosure. FIG. 3C is an illumination pupil distribution with illumination lobes 302 shaped as geometric lenses (cat's eye shaped), in accordance with one or more embodiments of the present disclosure. For example, a geometric lens or cat's eye shape may be characterized by the intersection of two partially-overlapping circles. Further, the illumination pupil distributions in FIGS. 3A-3C each illustrate two pairs of illumination lobes 302 suitable for measurements of overlay targets 104 with grating structures 108 having periodicity along orthogonal measurement directions.

Referring to FIGS. 3A-3C, a cat's eye illumination lobe shape as illustrated in FIG. 3C may maximize the area of illumination 118 in the illumination pupil plane 132, which may facilitate high image brightness and reduced ringing in image edges relative to other distributions. In contrast, elliptical and circular illumination lobe shapes illustrated in FIGS. 3A and 3B effectively truncate the tips of the cat's eye distribution and thus reduce the minimum achievable pitch of grating structures 108 for which only the two selected diffraction orders are collected.

Referring now to FIGS. 4A-8C, various non-limiting examples of tailored illumination distributions suitable for limiting collection of diffracted light to two selected diffraction lobes is described in greater detail, in accordance with one or more embodiments of the present disclosure. In particular, FIGS. 4A-8C illustrate variations of illumination lobes having a cat's eye shape, though it is to be understood that this is merely for illustrative purposes and should not be interpreted as limiting. Rather, the concepts disclosed may be extended to any shape of illumination lobes.

Figure 4A:
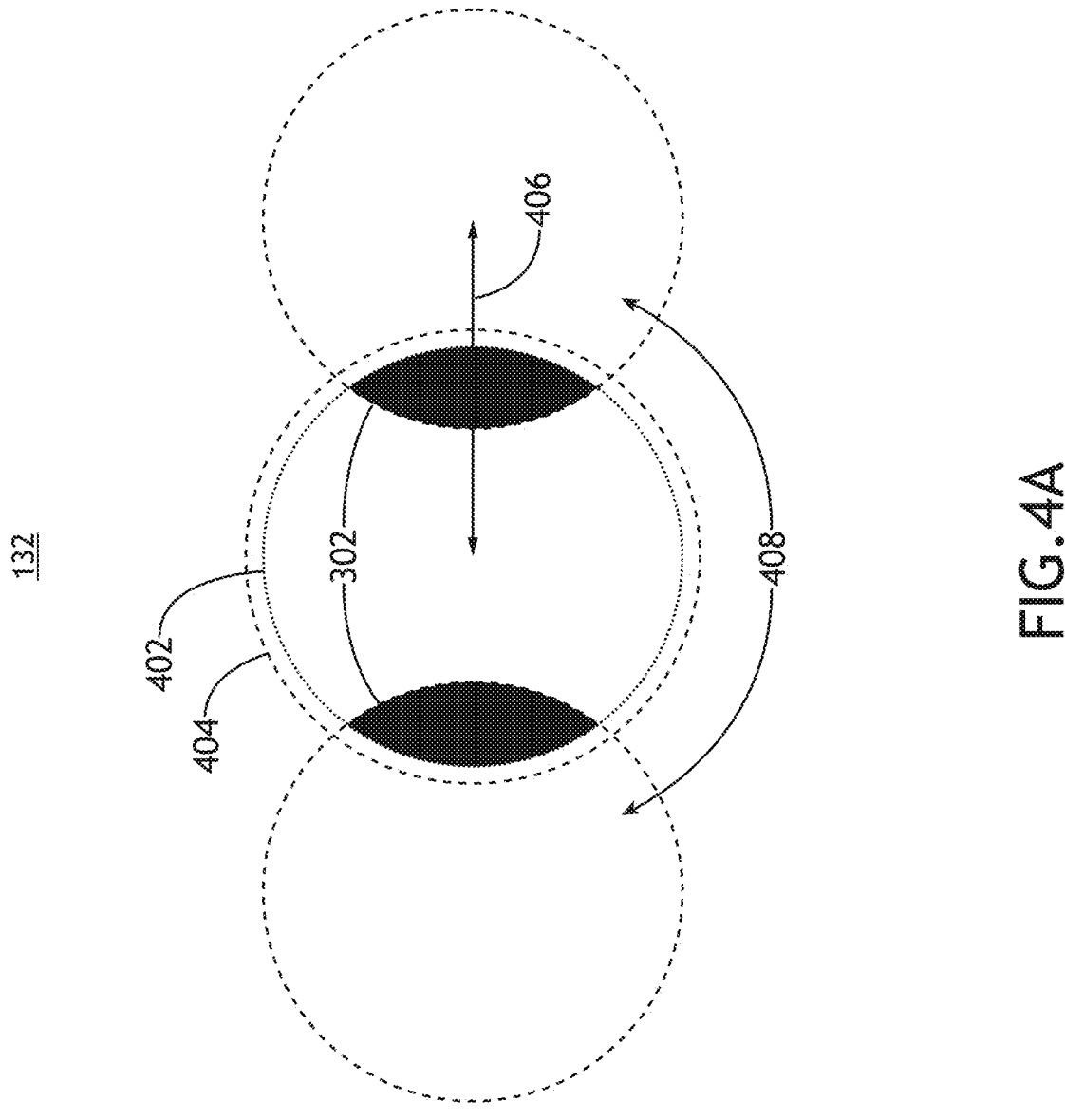
FIG. 4A is a conceptual view of an illumination pupil boundary including a dipole distribution of oblique illumination lobes superimposed on a collection pupil boundary, in accordance with one or more embodiments of the present disclosure.

FIG. 4A is a conceptual view of an illumination pupil boundary 402 including a dipole distribution of oblique illumination lobes 302 superimposed on a collection pupil boundary 404, in accordance with one or more embodiments of the present disclosure. For example, the illumination pupil boundary 402 and the collection pupil boundary 404 may represent the effective NA of the illumination pathway 120 and the collection pathway 122, respectively. In FIG. 4A, the illumination pupil boundary 402 is configured to be slightly smaller than the collection pupil boundary 404 (e.g., using an aperture at the illumination pupil plane 132). This configuration may be useful to ensure light throughput and avoid diffraction effects by collection optics (e.g., components of the collection pathway 122), but is not necessary. In some embodiments, the illumination pupil boundary 402 and the collection pupil boundary 404 are the same size (e.g., have the same NA).

FIG. 4A is a conceptual view of an illumination pupil plane 132 illustrating a dipole illumination distribution with illumination lobes 302 spread to provide oblique illumination near the edges of the illumination pupil boundary 402, here along a horizontal direction. Additionally, FIG. 4A illustrates a lobe-shearing NA 406 (NA$_{ishear}$), which is representative of the amount of shear or obliquity of the illumination lobes 302 relative to traditional normal-incidence illumination common for bright-field imaging. The sheared illumination pupil boundaries 408 are indicated solely to highlight the impact oblique illumination profiles and are not representative of actual pupil planes within the overlay metrology tool 102. Further, 0-order diffraction lobes are not explicitly illustrated within the collection pupil boundary 404 since they overlap with the illumination lobes 302 in this illumination distribution.

It is contemplated herein that value of the lobe-shearing NA 406 may impact the size of the illumination lobes 302 in the illumination pupil plane 132 since the lobe-shearing NA 406 may generally be increased as the illumination lobes 302 become smaller. In this way, the value of the lobe-shearing NA 406 may be selected to balance the performance tradeoffs as described previously herein such as, but not limited to, illumination throughput, spatial coherence and the associated impact on ringing of image edges, or the minimum pitch of grating structures 108 that may be imaged using the techniques described herein.

Figure 4B:
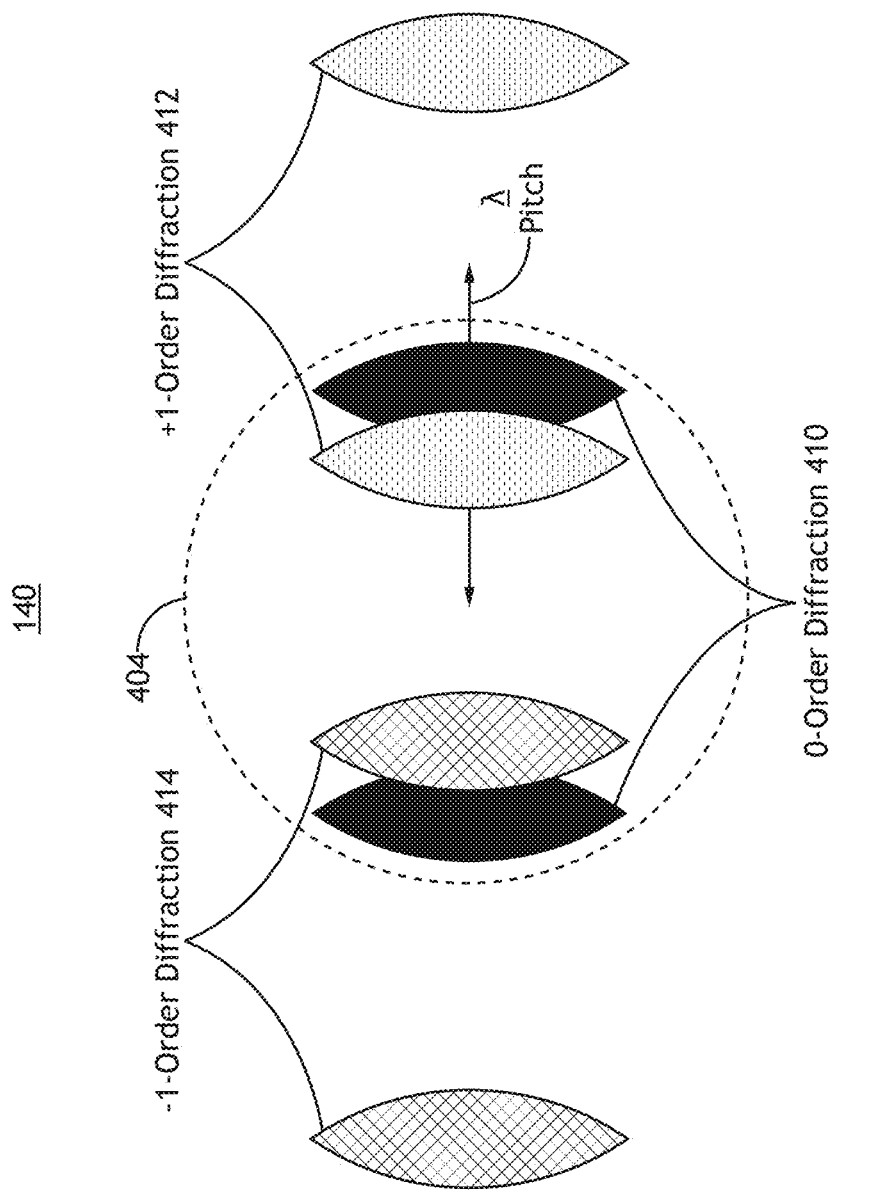
FIG. 4B is a conceptual view of the collection pupil plane associated with the diffraction of the illumination distribution of FIG. 4A by horizontal grating structures, in accordance with one or more embodiments of the present disclosure.
Figure 4C:
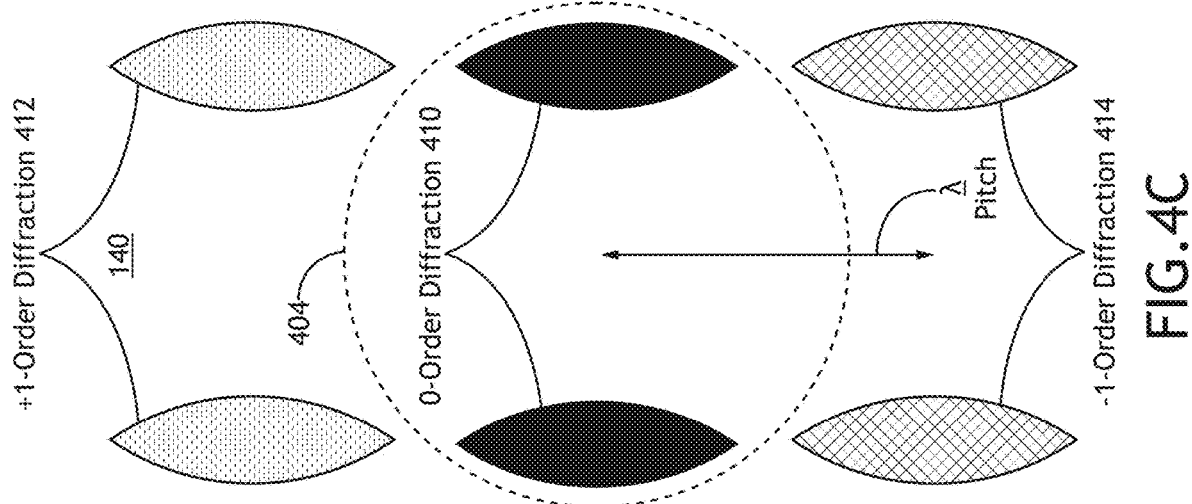
FIG. 4C is a conceptual view of the collection pupil plane associated with the diffraction of the illumination distribution of FIG. 4A by vertical grating structures, in accordance with one or more embodiments of the present disclosure.

FIG. 4B is a conceptual view of the collection pupil plane 140 associated with the diffraction of the illumination distribution of FIG. 4A by horizontal grating structures 108 (e.g., cells 202b,d in FIG. 2), in accordance with one or more embodiments of the present disclosure. FIG. 4C is a conceptual view of the collection pupil plane 140 associated with the diffraction of the illumination distribution of FIG. 4A by vertical grating structures 108 (e.g., cells 202a,c in FIG. 2), in accordance with one or more embodiments of the present disclosure.

FIGS. 4B and 4C illustrate 0-order diffraction lobes 410, +1 order diffraction lobes 412, and –1 order diffraction lobes 414 associated with diffraction of the distribution of illumination lobes 302 shown in FIG. 4A. In some embodiments, the overlay metrology tool 102 may be configured (e.g., according to a metrology recipe) to provide that only the 0-order diffraction lobes 410 and one of the first-order diffraction lobes (e.g., one of the +1 order diffraction lobes 412 or one of the –1 order diffraction lobes 414) from each of the illumination lobes 302 lie within the collection pupil boundary 404. For example, FIG. 4B illustrates the capture of the 0-order diffraction lobes 410 along with a single +1 order diffraction lobe 412 from one of the 0-order diffraction lobes 410 and a single –1 order diffraction lobe 414 from the other of the 0-order diffraction lobes 410.

As described previously herein, bright-field imaging based exclusively on two diffraction orders (e.g., a 0-order diffraction lobe 410 and one of a +1-order diffraction lobe 412 or a –1 order diffraction lobe 414 associated with any particular illumination lobe 302) may provide high-contrast imaging that is robust to sample defocus errors. Put another way, a configuration in which a truncated portion of any of the diffraction lobes would decrease the contrast of a resulting image.

FIG. 4B graphically illustrates the impact of the distribution of diffracted orders on a ratio of a wavelength of the illumination 118 to the pitch of grating structures 108 on an overlay target 104 (referred to as λ\Pitch). For example, the λ\Pitch ratio may impact a separation between diffracted orders. In a general sense, a minimum pitch of grating structures 108 that can be imaged using the techniques disclosed herein for a given wavelength may be achieved by adjusting the λ\Pitch ratio to provide that a collected first-order diffraction lobe 412 or 414 lies at the edges of collection pupil boundary 404, but are not truncated by the collection pupil boundary 404.

However, as illustrated in FIG. 2, it is often desirable to image an overlay target 104 having orthogonal grating structures 108 to provide overlay measurements along the associated orthogonal measurement directions. In this case, consideration of diffraction from all grating structures 108 must be considered.

Accordingly, FIG. 4C illustrates a configuration of the overlay metrology tool 102 in which various parameters (e.g., the illumination distribution, the λ\Pitch ratio, or the like) are selected such that no first-order diffraction lobes along the vertical direction are collected. However, the configuration illustrated in FIG. 4C provides that the vertical diffraction lobes lie just outside the collection pupil boundary 404 and thus represents a configuration for a lower limit on the pitch of grating structures 108 that may be imaged using the techniques disclosed herein for a particular wavelength when the overlay target 104 has orthogonal grating structures 108. In this way, such a dipole illumination distribution in FIG. 3A may be suitable for imaging horizontal grating structures 108 within an overlay target 104, where vertical grating structures 108 in the same or a different overlay target 104 may be imaged by a similar dipole illumination distribution to FIG. 3A but rotated by 90 degrees.

Figure 5A:
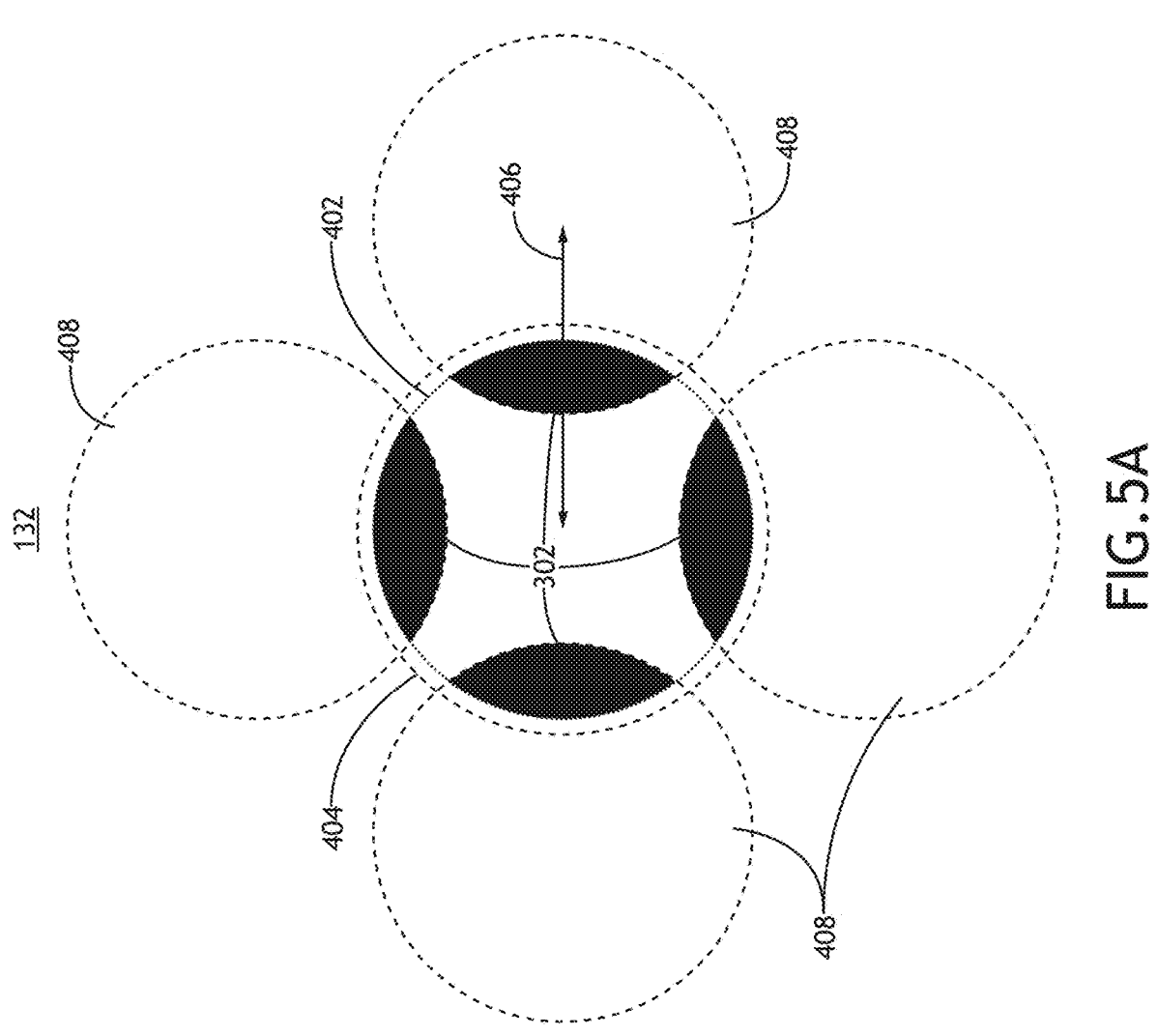
FIG. 5A is a conceptual view of an illumination pupil boundary including a quadrupole distribution of oblique illumination lobes superimposed on a collection pupil boundary, in accordance with one or more embodiments of the present disclosure.
Figure 5B:
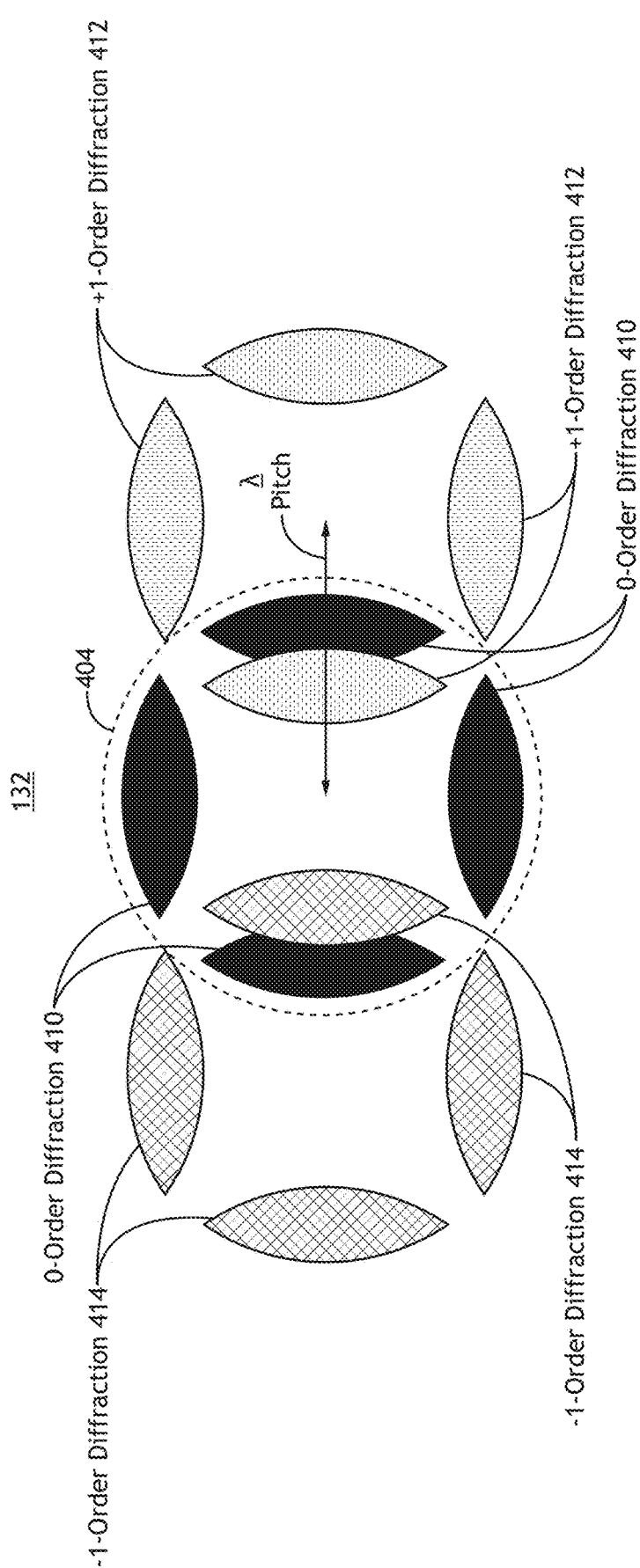
FIG. 5B is a conceptual view of the collection pupil plane associated with the diffraction of the illumination distribution of FIG. 5A by horizontal grating structures, in accordance with one or more embodiments of the present disclosure.
Figure 5C:
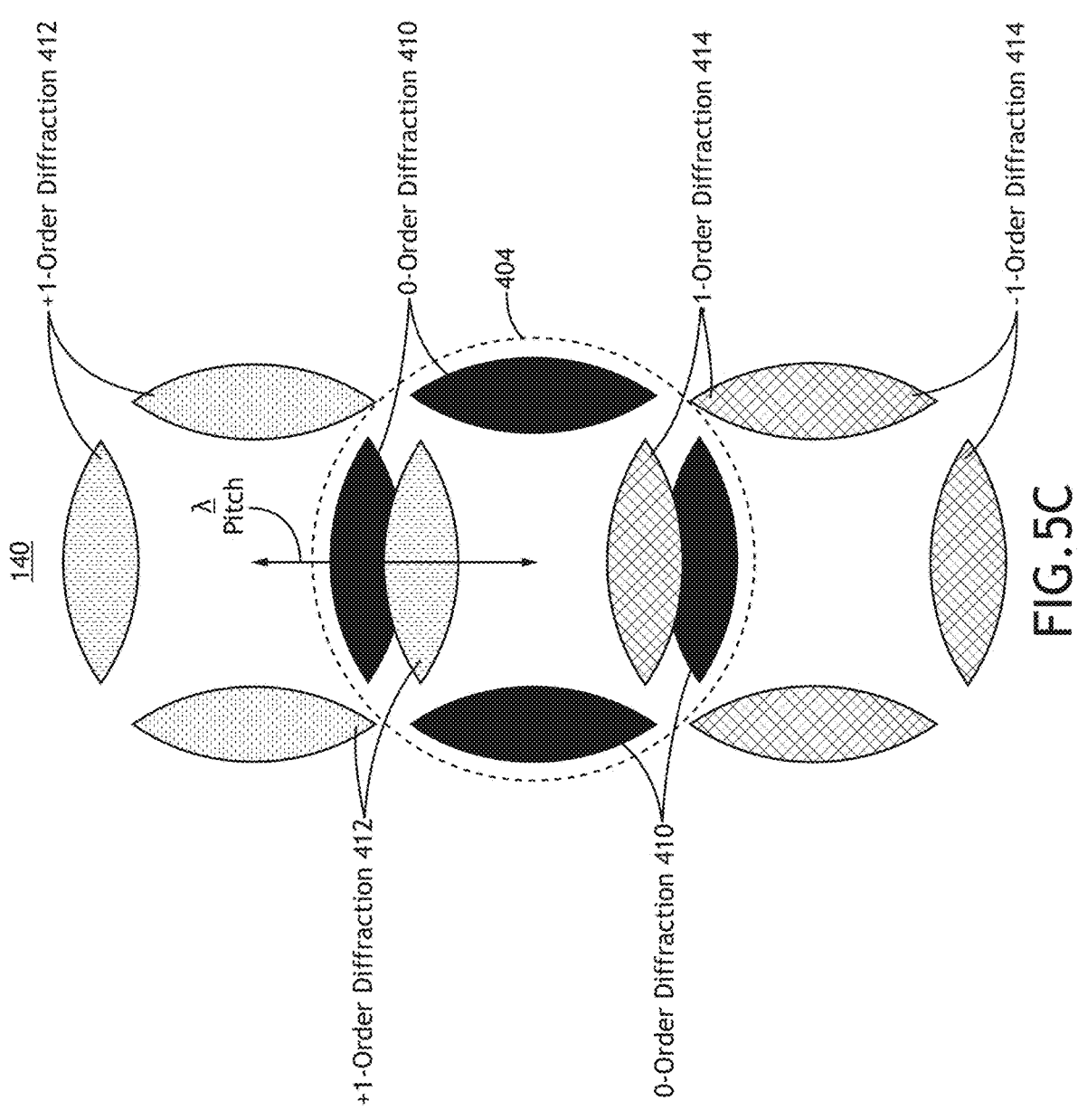
FIG. 5C is a conceptual view of the collection pupil plane associated with the diffraction of the illumination distribution of FIG. 5A by vertical grating structures, in accordance with one or more embodiments of the present disclosure.

FIGS. 5A-5C illustrate illumination and diffraction patterns for a quadrupole illumination distribution. FIG. 5A is a conceptual view of an illumination pupil boundary 402 including with a quadrupole distribution of oblique illumination lobes 302 superimposed on a collection pupil boundary 404, in accordance with one or more embodiments of the present disclosure. FIG. 5B is a conceptual view of the collection pupil plane 140 associated with the diffraction of the illumination distribution of FIG. 5A by horizontal grating structures 108 (e.g., cells 202b,d in FIG. 2), in accordance with one or more embodiments of the present disclosure. FIG. 5C is a conceptual view of the collection pupil plane 140 associated with the diffraction of the illumination distribution of FIG. 5A by vertical grating structures 108 (e.g., cells 202a,c in FIG. 2), in accordance with one or more embodiments of the present disclosure.

It is contemplated herein that the quadrupole illumination distribution in FIG. 5A corresponds to two orthogonal dipole illumination distributions of the type illustrated in FIG. 4A. Accordingly, descriptions of FIGS. 4A-4C may be extended to apply to FIGS. 5A-5C. In this way, the quadrupole illumination distribution in FIG. 5A may facilitate simultaneous imaging of horizontal and vertical grating structures 108 using the techniques disclosed herein.

Equations (1) and (2) further describe the range of the λ\Pitch ratios for imaging using the dipole or quadrupole illumination distributions of FIGS. 4A and 5A using the techniques disclosed herein. For example, Equations (1) and (2) further describe limiting conditions for the collection of at most a single first-order diffraction lobe from any particular illumination lobe 302 by any particular grating structure 108 as illustrated in FIGS. 4A-5C.

$$\frac{\lambda}{P} \leq NA_{obj} + NA_{ishear} - NA_{iOuter} \qquad (1)$$

$$\frac{\lambda}{P} \geq \frac{NA_{obj} + NA_{ishear} - NA_{iOuter}}{2} \qquad (2)$$

In Equations (1) and (2), P is the pitch of the grating structures 108, $NA_{obj}$ is the NA of the objective lens 136 (e.g., the collection pupil boundary 404), $NA_{ishear}$ is the lobe-shearing NA 406, and $NA_{iOuter}$ is the illumination NA (e.g., the illumination pupil boundary 402).

Figure 6:
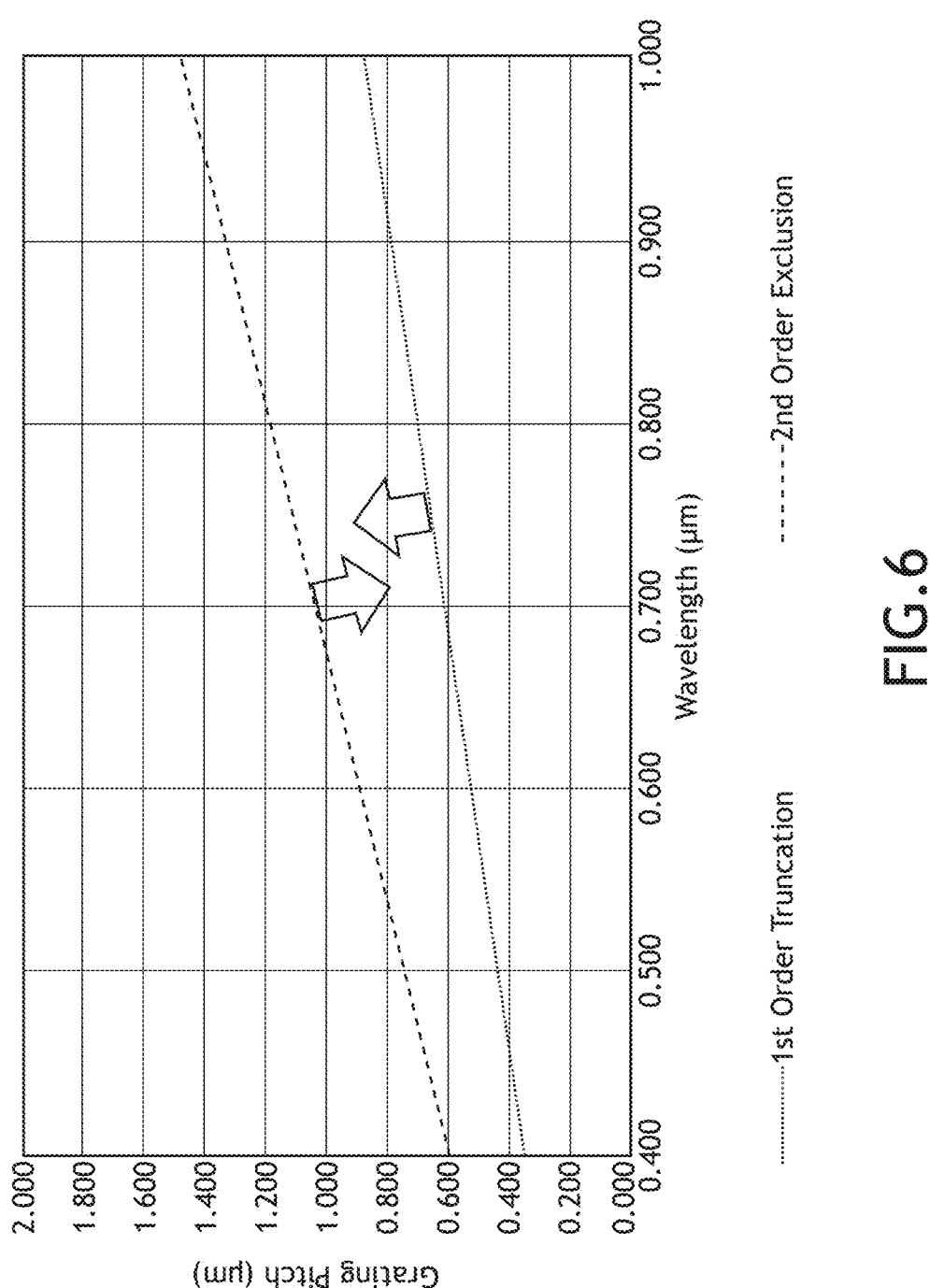
FIG. 6 is a plot of pitch (P) as a function of wavelength (λ) of illumination for tailored bright-field imaging with selected diffraction orders based on dipole or quadrupole illumination distributions, in accordance with one or more embodiments of the present disclosure.

FIG. 6 is a plot of pitch (P) as a function of wavelength (λ) of illumination 118 for tailored bright-field imaging with selected diffraction orders based on dipole or quadrupole illumination distributions, in accordance with one or more embodiments of the present disclosure. In particular, combinations of the pitch (P) and wavelength (λ) satisfying Equations (1) and (2) lie within the plot lines in FIG. 6 as indicated by the arrows. Further, FIG. 6 illustrates a particular configuration in which $NA_{obj}$=0.70, $NA_{iOuter}$=0.65, and $NA_{ishear}$=1.10, though it is to be understood that this configuration is provided solely for illustrative purposes and should not be interpreted as limiting the present disclosure.

FIGS. 7A-8C present alternative illumination distributions and associated diffraction profiles, in accordance with one or more embodiments of the present disclosure.

Figure 7A:
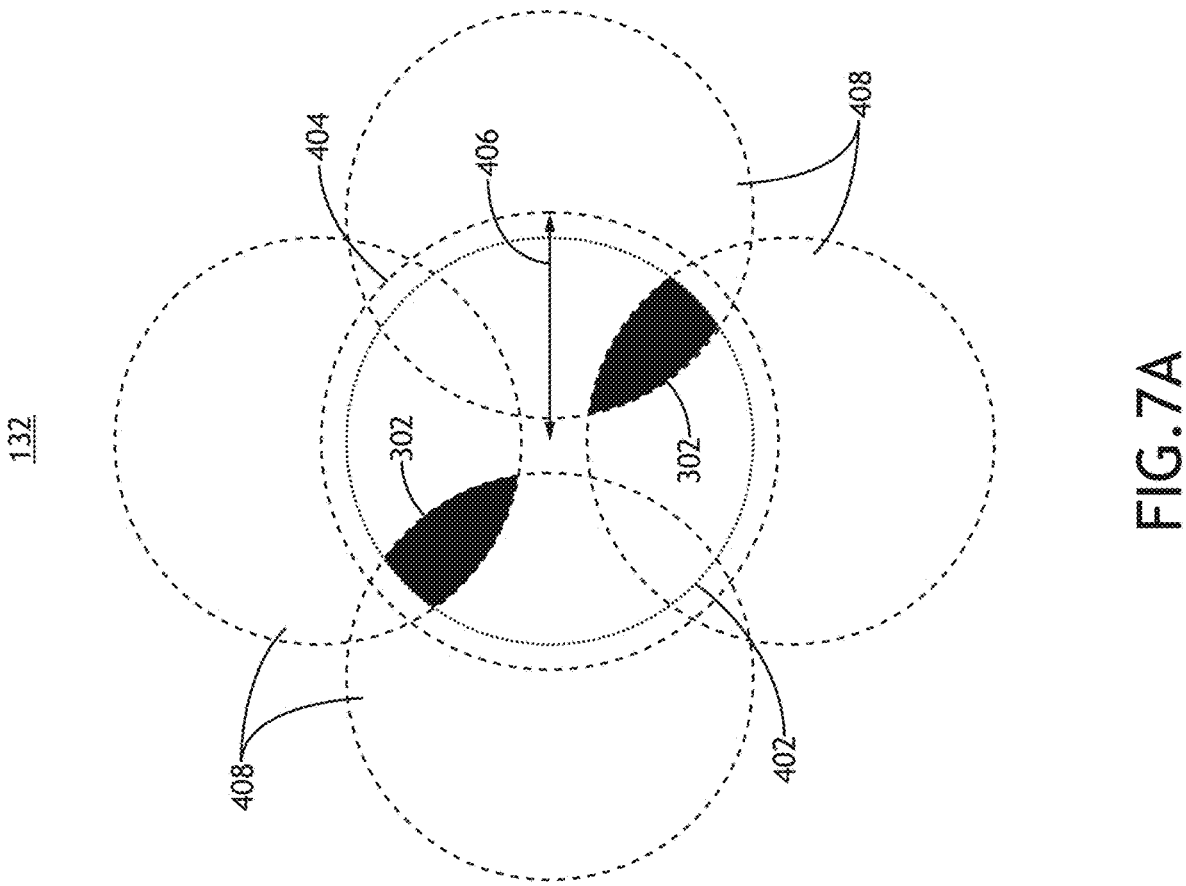
FIG. 7A is a conceptual view of an illumination pupil boundary including a rotated dipole distribution of oblique illumination lobes superimposed on a collection pupil boundary, in accordance with one or more embodiments of the present disclosure.
Figure 7B:
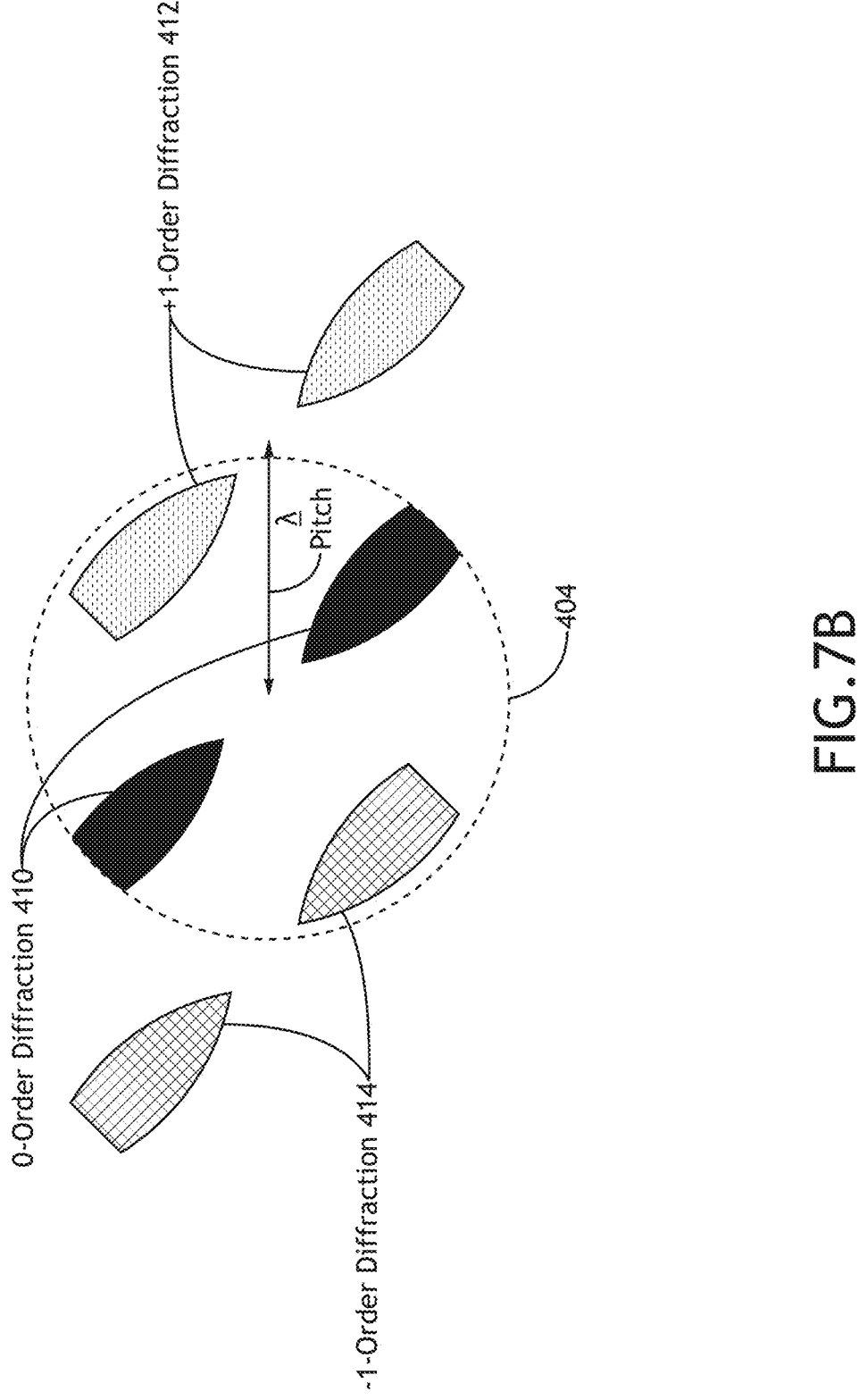
FIG. 7B is a conceptual view of the collection pupil plane associated with the diffraction of the illumination distribution of FIG. 7A by horizontal grating structures, in accordance with one or more embodiments of the present disclosure.
Figure 7C:
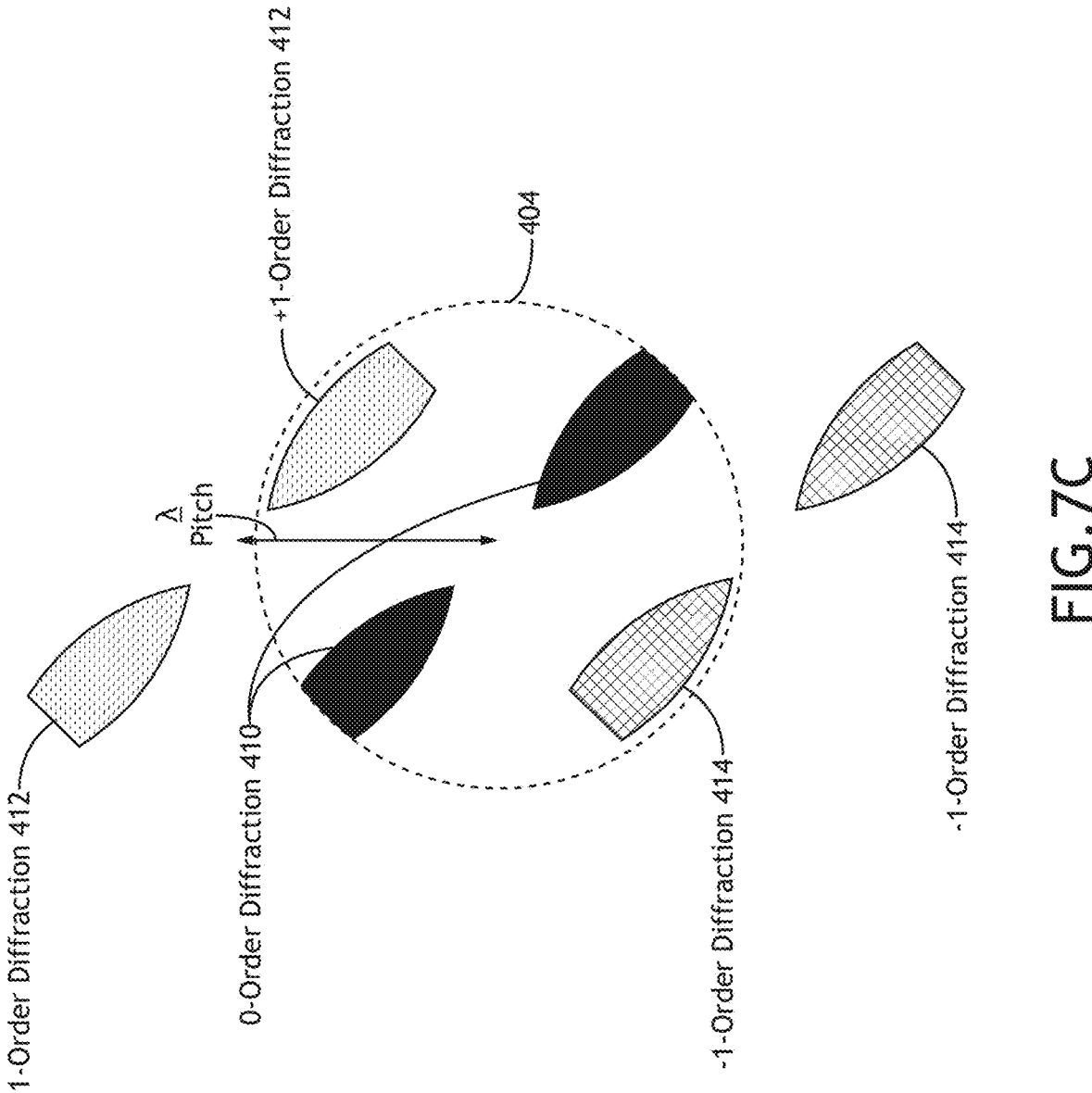
FIG. 7C is a conceptual view of the collection pupil plane associated with the diffraction of the illumination distribution of FIG. 7A by vertical grating structures, in accordance with one or more embodiments of the present disclosure.

FIG. 7A is a conceptual view of an illumination pupil boundary 402 including a rotated dipole distribution of oblique illumination lobes 302 superimposed on a collection pupil boundary 404, in accordance with one or more embodiments of the present disclosure. FIG. 7B is a conceptual view of the collection pupil plane 140 associated with the diffraction of the illumination distribution of FIG. 7A by horizontal grating structures 108 (e.g., cells 202b,d in FIG. 2), in accordance with one or more embodiments of the present disclosure. FIG. 7C is a conceptual view of the collection pupil plane 140 associated with the diffraction of the illumination distribution of FIG. 7A by vertical grating structures 108 (e.g., cells 202a,c in FIG. 2), in accordance with one or more embodiments of the present disclosure.

As illustrated in FIGS. 7A-7C, an illumination lobe 302 in a rotated dipole illumination distribution may provide a configuration in which a 0-order diffraction lobe 410 and a single first-order diffraction lobe may be collected based on diffraction from both horizontal and vertical grating structures 108.

Figure 8A:
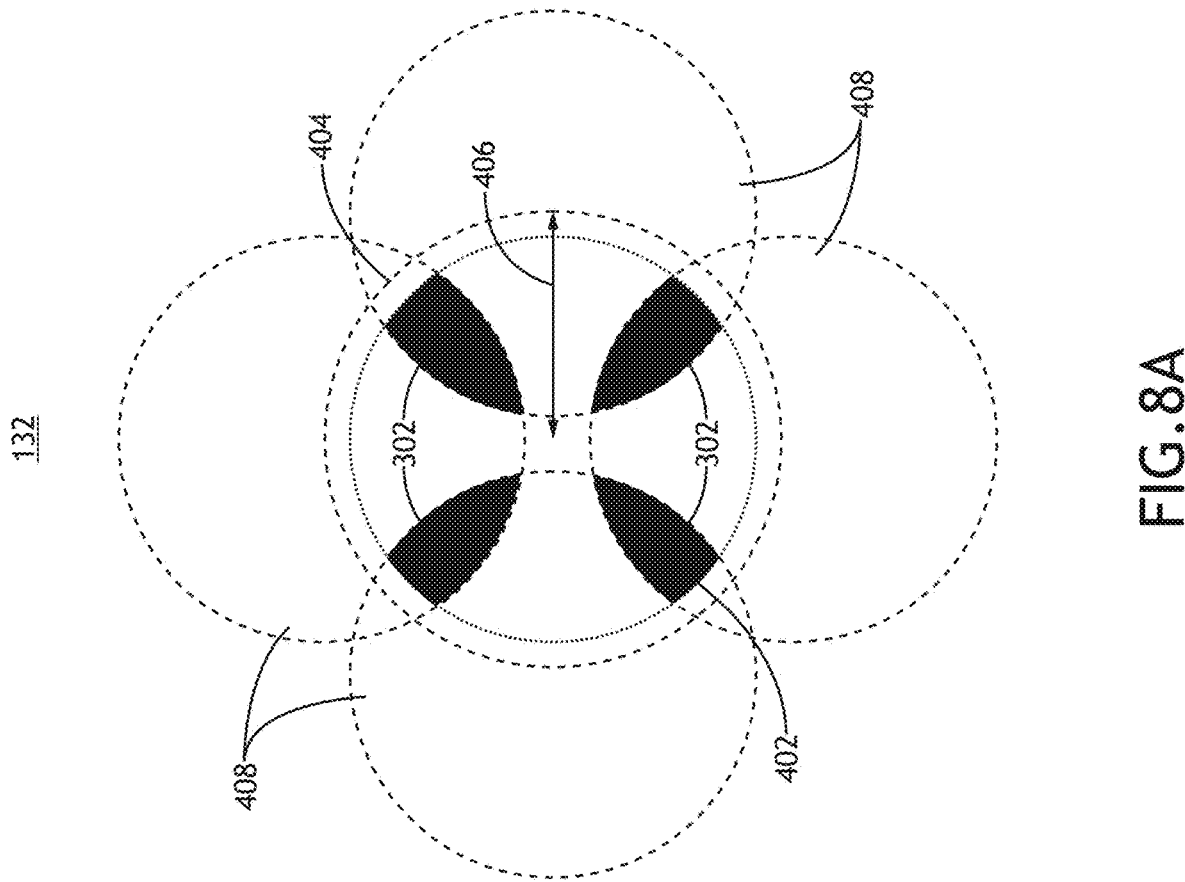
FIG. 8A is a conceptual view of an illumination pupil boundary including a rotated quadrupole distribution of oblique illumination lobes superimposed on a collection pupil boundary, in accordance with one or more embodiments of the present disclosure.
Figure 8B:
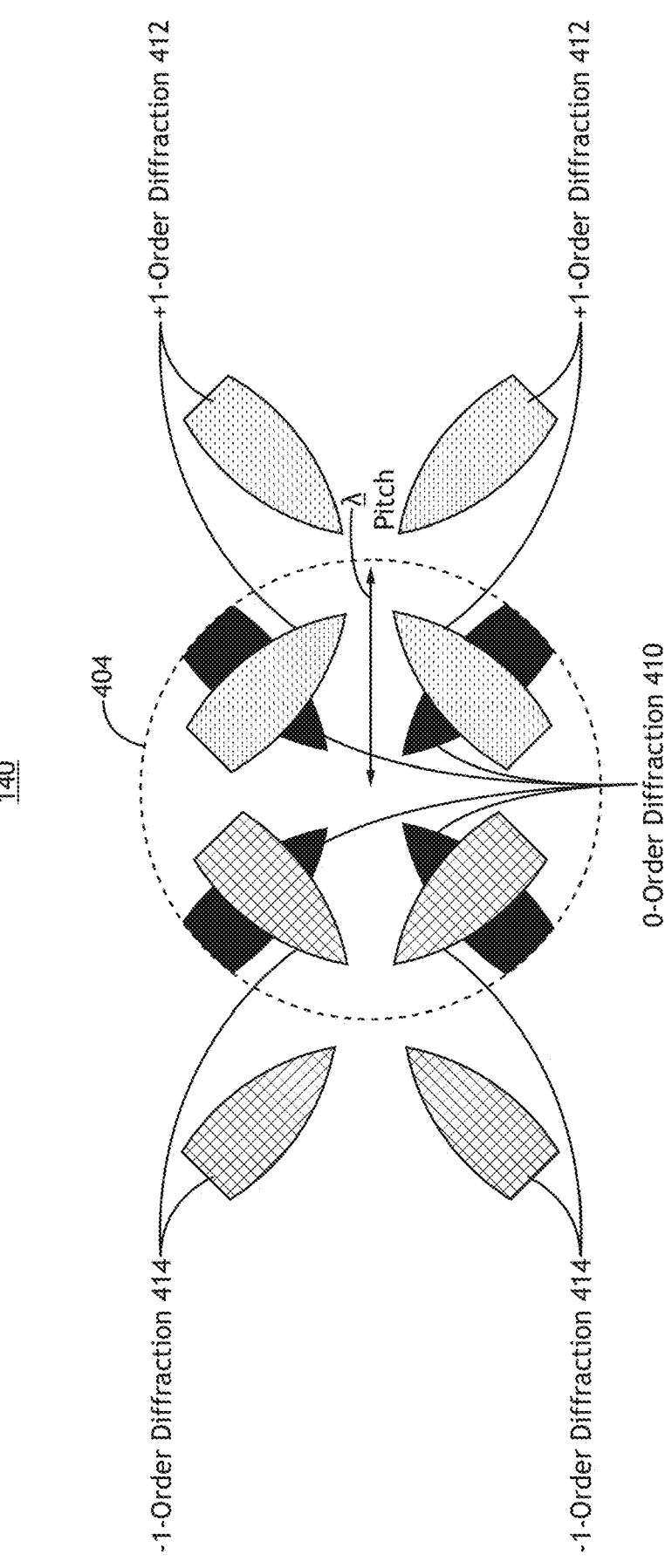
FIG. 8B is a conceptual view of the collection pupil plane associated with the diffraction of the illumination distribution of FIG. 8A by horizontal grating structures, in accordance with one or more embodiments of the present disclosure.
Figure 8C:
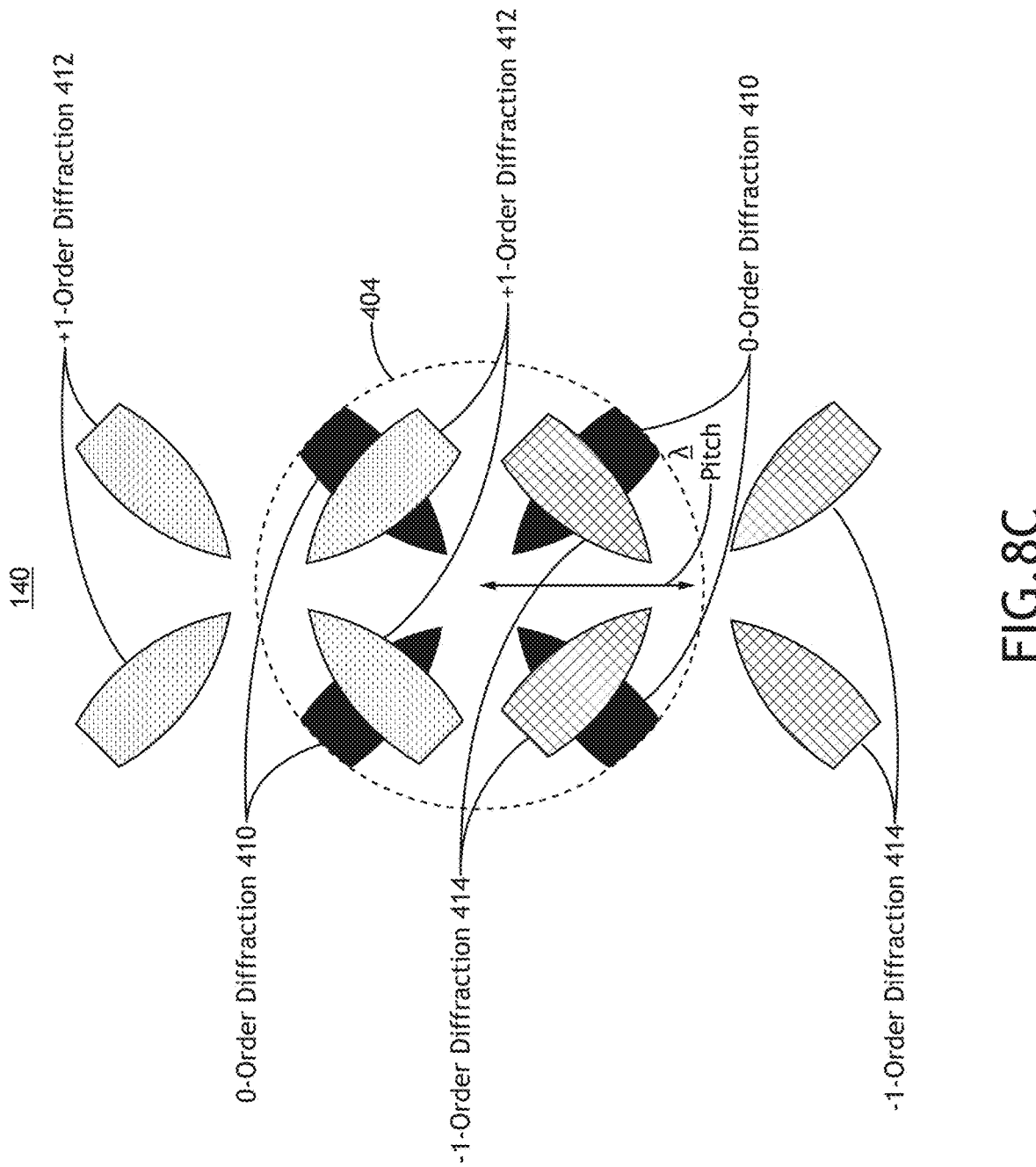
FIG. 8C is a conceptual view of the collection pupil plane associated with the diffraction of the illumination distribution of FIG. 8A by vertical grating structures, in accordance with one or more embodiments of the present disclosure.

FIG. 8A is a conceptual view of an illumination pupil boundary 402 including a rotated quadrupole distribution of oblique illumination lobes 302 superimposed on a collection pupil boundary 404, in accordance with one or more embodiments of the present disclosure. FIG. 8B is a conceptual view of the collection pupil plane 140 associated with the diffraction of the illumination distribution of FIG. 8A by horizontal grating structures 108 (e.g., cells 202b,d in FIG. 2), in accordance with one or more embodiments of the present disclosure. FIG. 8C is a conceptual view of the collection pupil plane 140 associated with the diffraction of the illumination distribution of FIG. 8A by vertical grating structures 108 (e.g., cells 202a,c in FIG. 2), in accordance with one or more embodiments of the present disclosure.

It is contemplated herein that the rotated quadrupole illumination distribution in FIG. 8A corresponds to two orthogonal rotated dipole illumination distributions of the type illustrated in FIG. 7A. Accordingly, descriptions of FIGS. 4A-7C may be extended to apply to FIGS. 8A-8C.

Equations (3) and (4) further describe the range of the λ\Pitch ratios for imaging using the rotated dipole or rotated quadrupole illumination distributions of FIGS. 7A and 8A using the techniques disclosed herein. For example, Equations (3) and (4) further describe limiting conditions for the collection of at most a single first-order diffraction lobe from any particular illumination lobe 302 by any particular grating structure 108 as illustrated in FIGS. 7A-8C.

$$\frac{\lambda}{P} \leq NA_{obj} + NA_{ishear} - NA_{iOuter} \qquad (3)$$

$$\frac{\lambda}{P} \geq \frac{\sqrt{NA_{iOuter}^2 - \left(\frac{NA_{iShear}}{2}\right)^2} + \sqrt{NA_{Obj}^2 - \left(\frac{NA_{iShear}}{2}\right)^2}}{2} \qquad (4)$$

Figure 9:
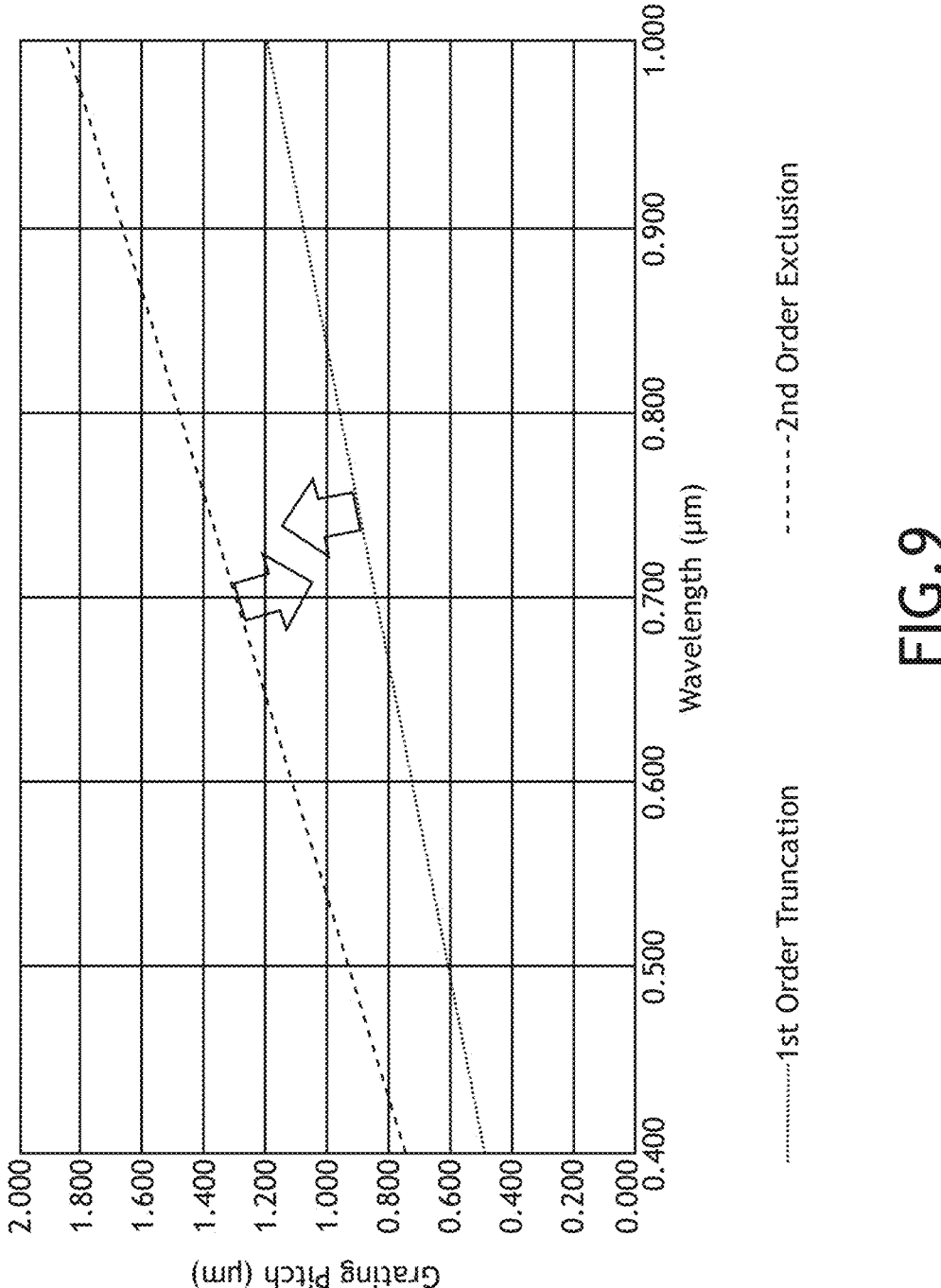
FIG. 9 is a plot of pitch (P) as a function of wavelength (λ) of illumination for tailored bright-field imaging with selected diffraction orders based on rotated dipole or rotated quadrupole illumination distributions, in accordance with one or more embodiments of the present disclosure.

FIG. 9 is a plot of pitch (P) as a function of wavelength (λ) of illumination 118 for tailored bright-field imaging with selected diffraction orders based on rotated dipole or rotated quadrupole illumination distributions, in accordance with one or more embodiments of the present disclosure. In particular, combinations of the pitch (P) and wavelength (λ) satisfying Equations (3) and (4) lie within the plot lines in FIG. 9 as indicated by the arrows. Further, FIG. 9 is based on the same values of $NA_{obj}$, $NA_{iOuter}$, and $NA_{ishear}$ as in FIG. 6, though it is to be understood that this configuration is provided solely for illustrative purposes and should not be interpreted as limiting the present disclosure.

Figure 10:
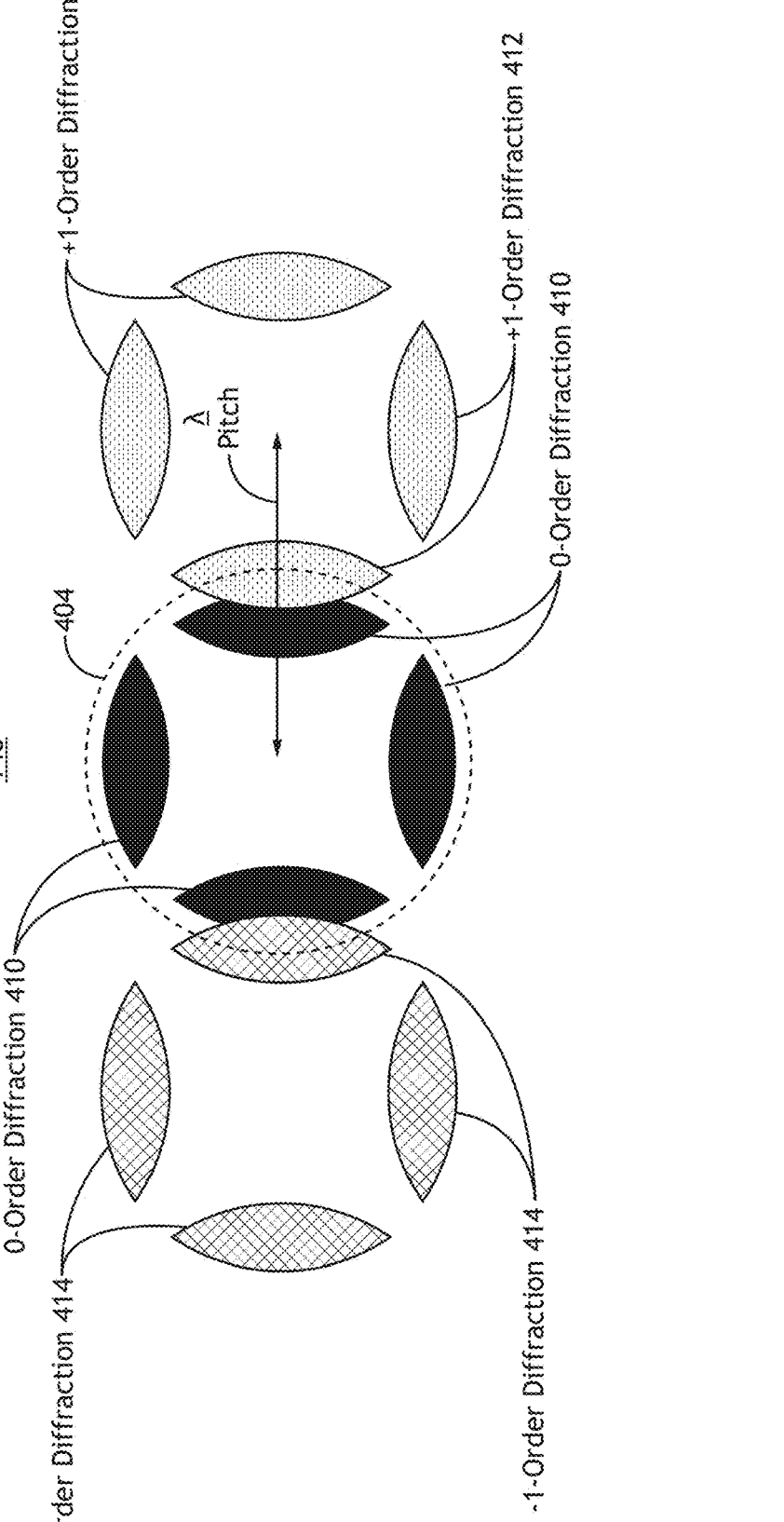
FIG. 10 is a conceptual view of the collection pupil plane associated with the diffraction of the illumination distribution of FIG. 5A in which the first-order diffraction lobes are truncated, in accordance with one or more embodiments of the present disclosure.

Referring generally to FIGS. 4A-8C and as described previously herein, in some embodiments, any collected diffraction lobes lie fully within the collection pupil boundary 404 such that they are not truncated. In this way, any particular diffraction lobe is either fully within or fully outside of the collection pupil boundary 404. FIG. 10 is a conceptual view of the collection pupil plane 140 associated with the diffraction of the illumination distribution of FIG. 5A in which the first-order diffraction lobes 412, 414 are truncated, in accordance with one or more embodiments of the present disclosure. It is contemplated herein that an image based on sample light 124 as collected in FIG. 10 may have less contrast than an image based on sample light 124 as collected in FIGS. 5B and 5C. Further, it is to be understood that the depiction in FIG. 10 based on the particular illumination profile of FIG. 5A is provided solely for illustrative purposes and should not be interpreted as limiting the present disclosure. Rather, diffraction from an illumination lobe 302 of any shape may be truncated.

Referring now to FIGS. 11-13C, imaging performance based on two selected diffraction orders from any particular illumination lobe 302 by any particular grating structure 108 is compared to traditional bright-field imaging.

Figure 11:
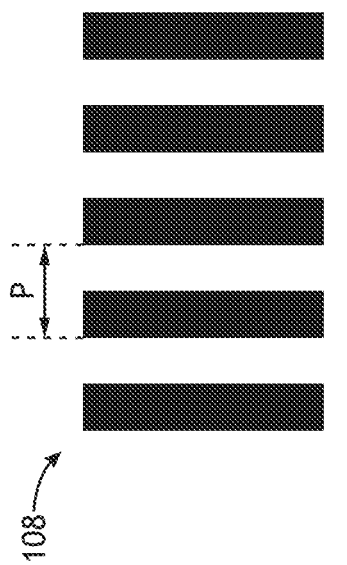
FIG. 11 is a simplified schematic of a grating structure with a pitch (P) along a single direction (e.g., an X direction), in accordance with one or more embodiments of the present disclosure.

FIG. 11 is a simplified schematic of a grating structure 108 with a pitch (P) along a single direction (e.g., an X direction), in accordance with one or more embodiments of the present disclosure. In this way, the grating structure 108 in FIG. 11 may be similar to cell 202b or cell 202d illustrated in FIG. 2.

Figure 12A:
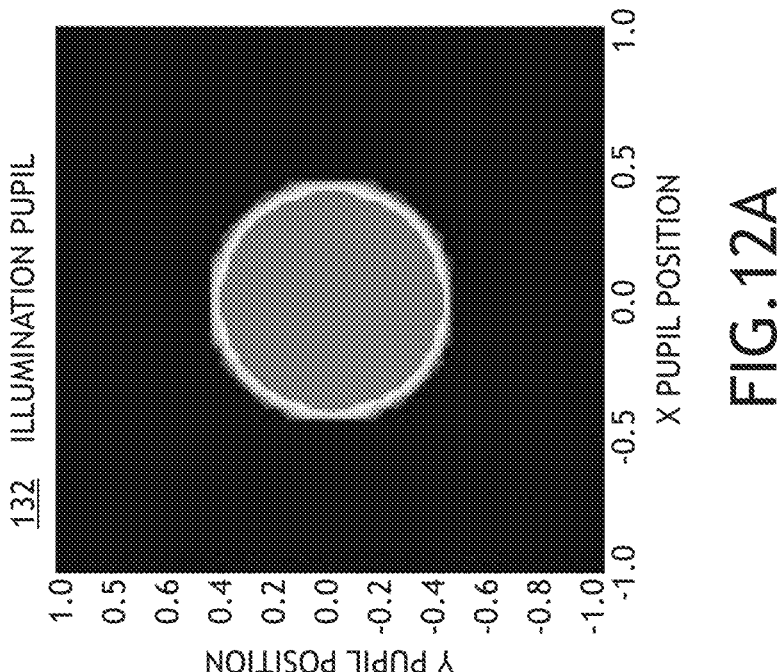
FIG. 12A is a plot of an illumination distribution for typical bright-field imaging that includes a single illumination lobe centered in an illumination pupil plane, in accordance with one or more embodiments of the present disclosure.
Figure 12B:
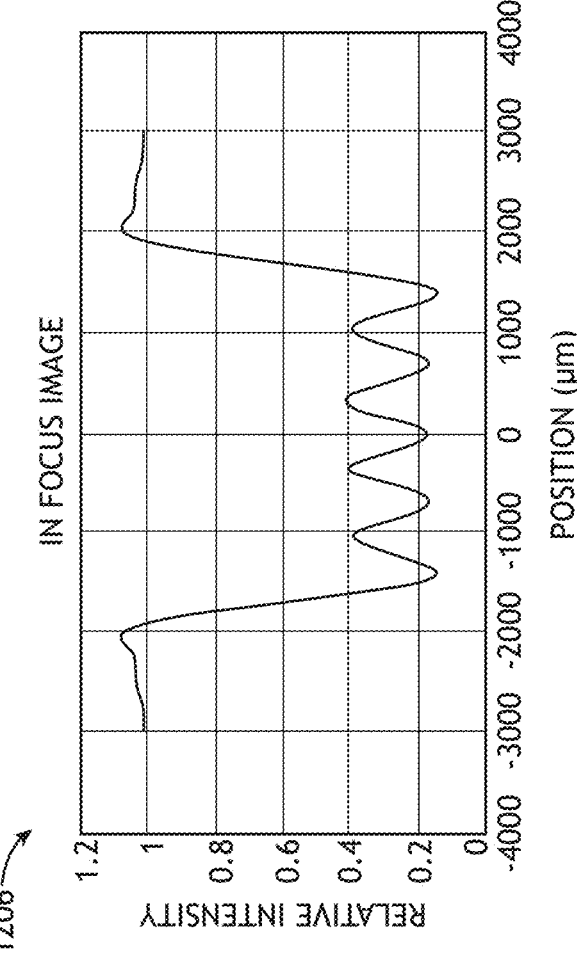
FIG. 12B is an in-focus image of the grating structure illustrated in FIG. 11 generated based on the illumination distribution in FIG. 12A and a representative cross-section, in accordance with one or more embodiments of the present disclosure.
Figure 12B:
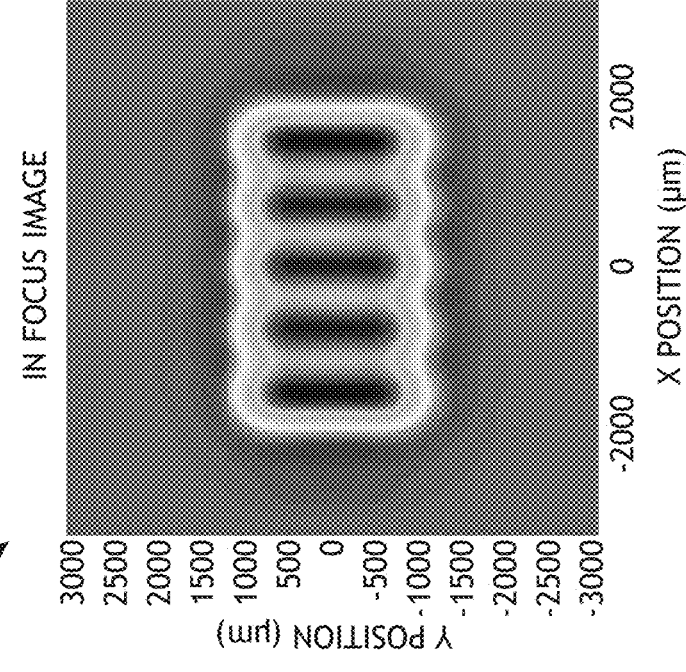
Figure 12C:
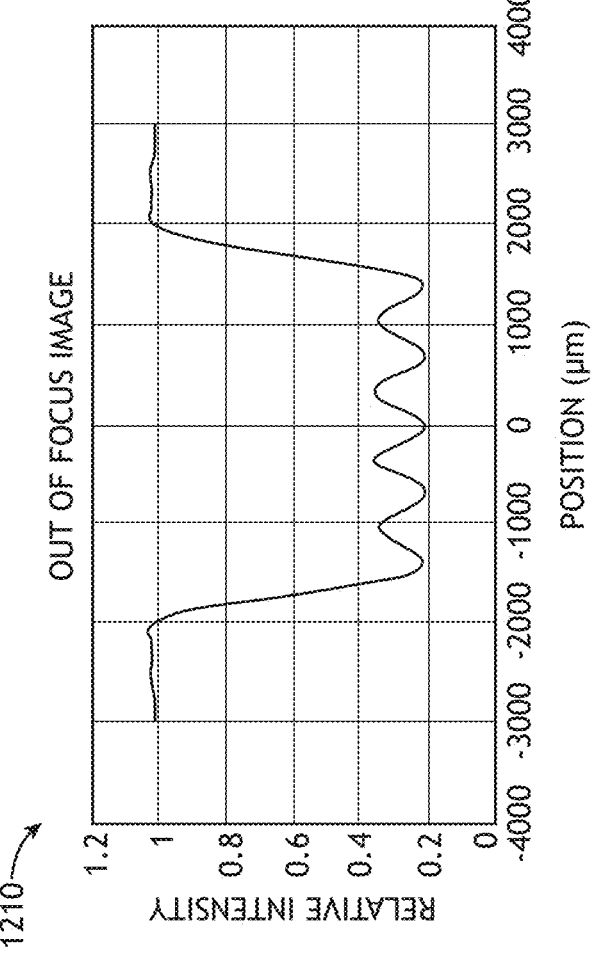
FIG. 12C is an out-of-focus image of the grating structure illustrated in FIG. 11 generated based on the illumination distribution in FIG. 12B and a representative cross-section, in accordance with one or more embodiments of the present disclosure.
Figure 12C:
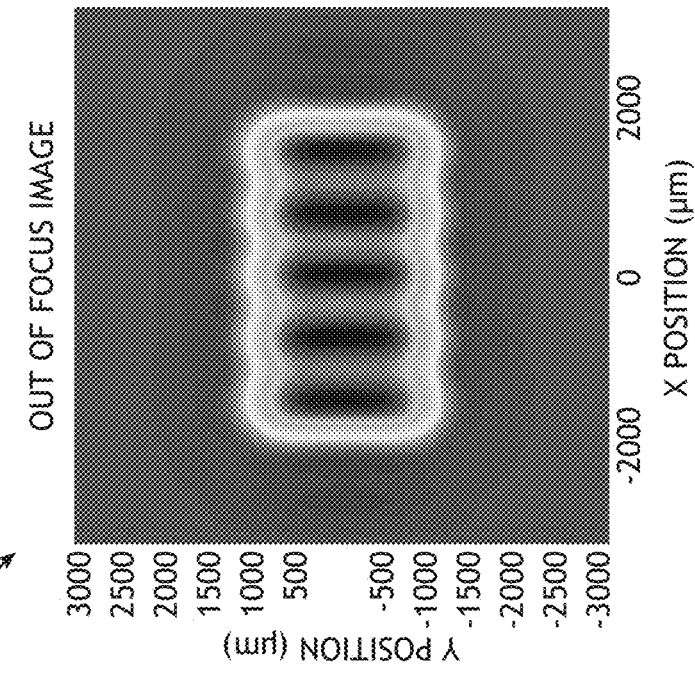

FIG. 12A is a plot of an illumination distribution (e.g., at an illumination pupil plane 132) for typical bright-field imaging that includes a single illumination lobe 1202 centered in an illumination pupil plane 132, in accordance with one or more embodiments of the present disclosure. FIG. 12B is an in-focus image 1204 of the grating structure 108 illustrated in FIG. 11 generated based on the illumination distribution in FIG. 12A and a representative cross-section 1206, in accordance with one or more embodiments of the present disclosure. FIG. 12C is an out-of-focus image 1208 of the grating structure 108 illustrated in FIG. 11 generated based on the illumination distribution in FIG. 12B and a representative cross-section 1210, in accordance with one or more embodiments of the present disclosure.

Figure 13A:
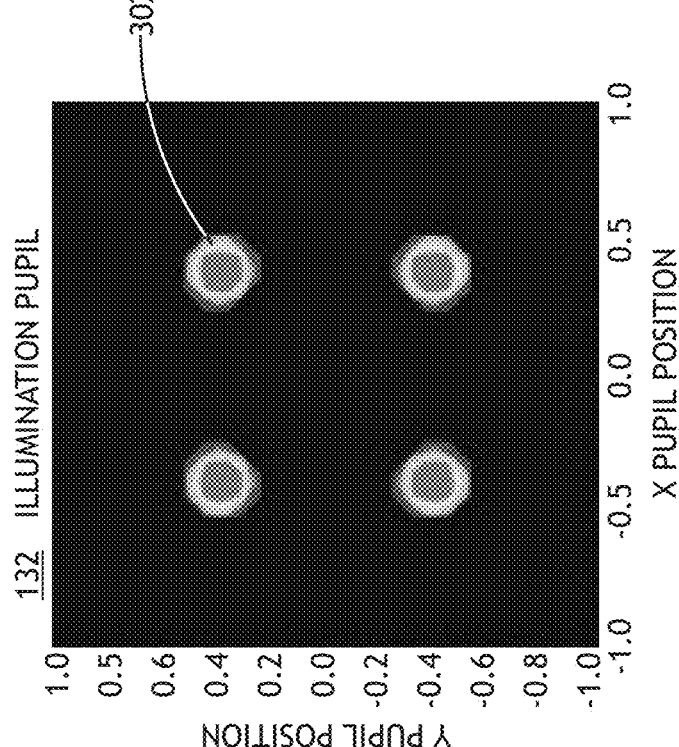
FIG. 13A is a plot of a quadrature illumination suitable for bright-field imaging with selected diffraction orders, in accordance with one or more embodiments of the present disclosure.
Figure 13B:
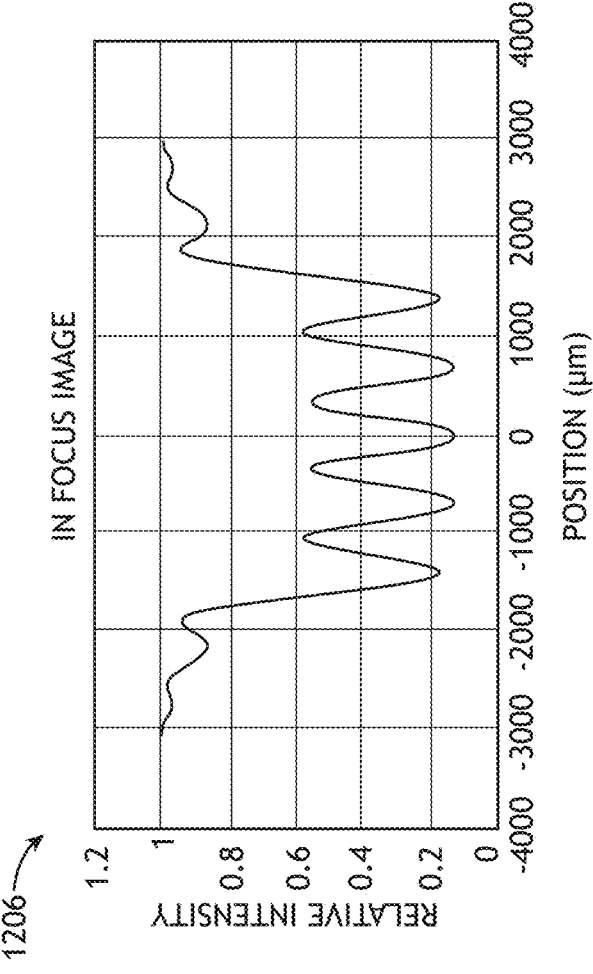
FIG. 13B is an in-focus image of the grating structure illustrated in FIG. 11 generated based on the illumination distribution in FIG. 13A and a representative cross-section, in accordance with one or more embodiments of the present disclosure.
Figure 13B:
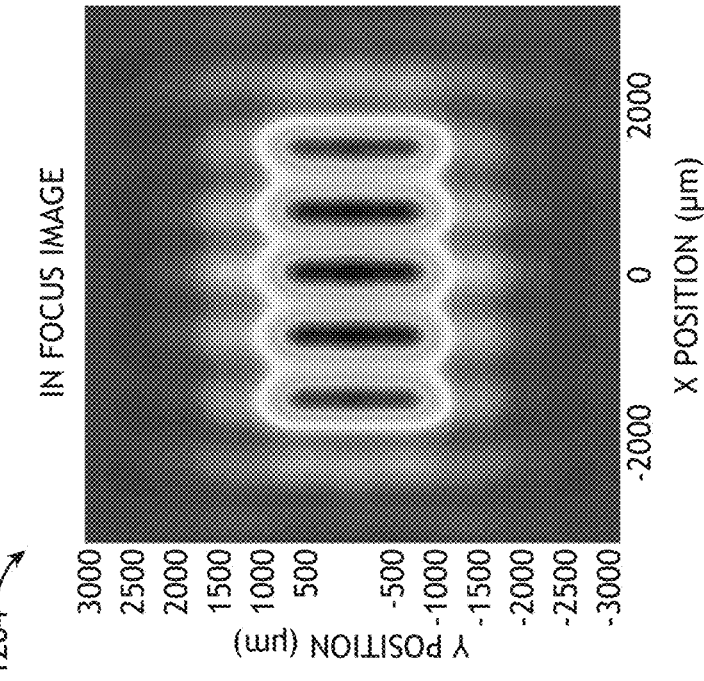
Figure 13C:
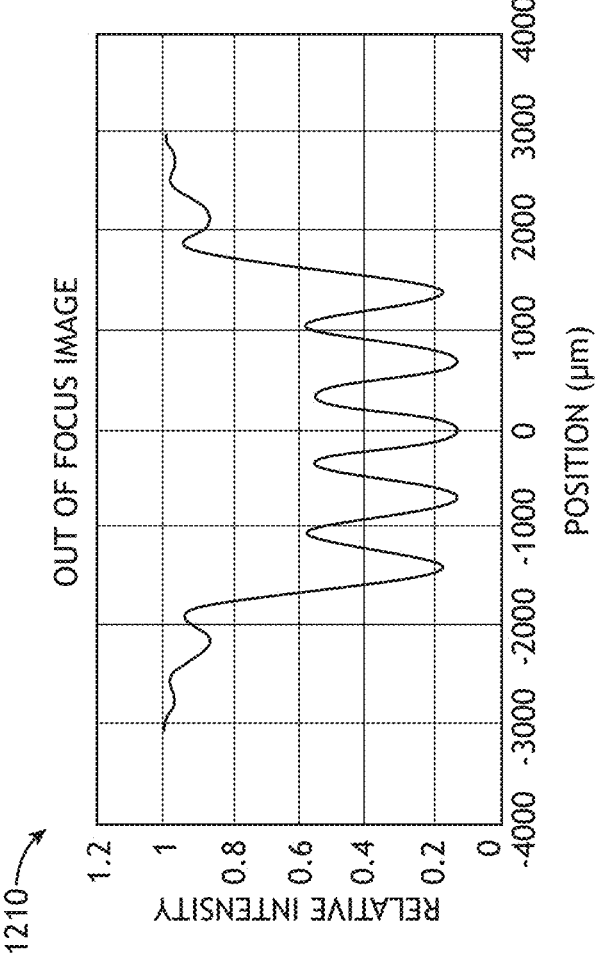
FIG. 13C is an out-of-focus image of the grating structure illustrated in FIG. 11 generated based on the illumination distribution in FIG. 13B and a representative cross-section, in accordance with one or more embodiments of the present disclosure.
Figure 13C:
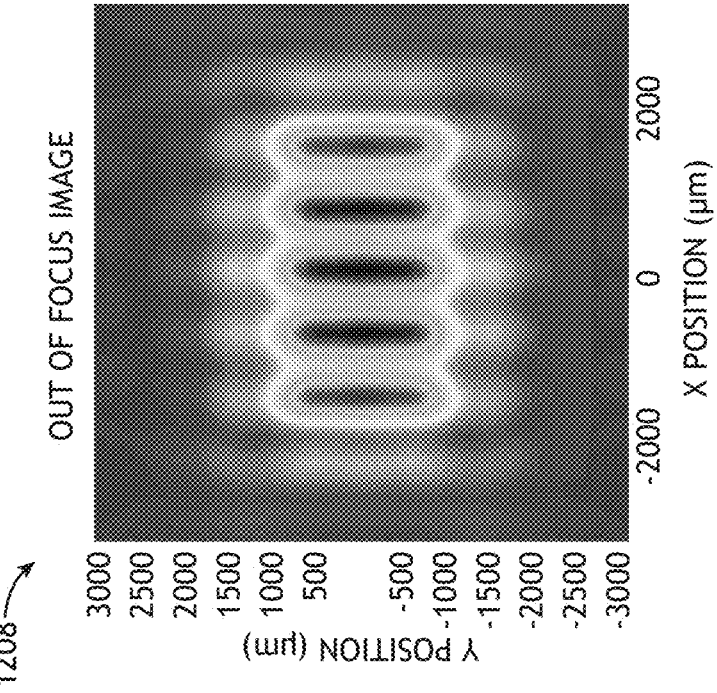

FIG. 13A is a plot of a quadrature illumination distribution of illumination lobes 302 (e.g., at an illumination pupil plane 132) suitable for bright-field imaging with selected diffraction orders, in accordance with one or more embodiments of the present disclosure. FIG. 13B is an in-focus image 1302 of the grating structure 108 illustrated in FIG. 11 generated based on the illumination distribution in FIG. 13A and a representative cross-section 1304, in accordance with one or more embodiments of the present disclosure. FIG. 13C is an out-of-focus image 1306 of the grating structure 108 illustrated in FIG. 11 generated based on the illumination distribution in FIG. 13B and a representative cross-section 1308, in accordance with one or more embodiments of the present disclosure.

A comparison of FIG. 13B with FIG. 12B indicates a substantially higher imaging contrast of the grating structures 108 in FIG. 13B using bright-field imaging with only two selected diffraction orders per illumination lobe 302 as disclosed herein relative to traditional bright-field imaging techniques. Similarly, a comparison of FIG. 13C with FIG. 12C indicates that imaging contrast as illustrated in FIG. 13C using bright-field imaging with only two selected diffraction orders per illumination lobe 302 as disclosed herein is substantially more robust to sample defocus errors (e.g., errors associated with the positioning of the sample 106 along an optical axis of the objective lens 136 in FIG. 1B) than traditional bright-field imaging techniques. Taken together, the imaging techniques disclosed herein provide not only better performance than traditional bright-field imaging techniques, but also more robust measurements.

Referring again to FIG. 1B, various techniques for implementing the various imaging techniques disclosed herein are described in greater detail, in accordance with one or more embodiments of the present disclosure.

It is contemplated herein that a distribution of the illumination 118 directed to the sample 106 (e.g., an illumination distribution) may be generated or controlled using any technique known in the art. In some embodiments, an illumination distribution is controlled using one or more apertures in an illumination pupil plane 132. For example, the entire illumination pupil may be illuminated (e.g., uniformly) such that the apertures may define one or more illumination lobes 302. In this way, the angular distribution of light within each illumination lobe 302 may be controlled by the position, size, and orientation of a corresponding aperture in the illumination pupil plane 132. As an illustration, inset 142 in FIG. 1B depicts an initial distribution of illumination 118 at an illumination pupil plane 132 and inset 144 depicts an aperture plate with a series of four apertures 146 suitable for generating a rotated quadrature illumination distribution such as the distribution in FIG. 8A by spatially filtering the initial distribution of illumination 118.

In some embodiments, illumination 118 from the illumination source is split and directed along one or more paths to different portions of the illumination pupil plane 132. It is contemplated herein that this approach may provide relatively higher throughput than aperture-based approaches since a greater portion of the illumination 118 may be directed into the illumination lobes 302.

For example, the overlay metrology tool 102 may generate a multi-lobe illumination 118 by diffracting illumination 118 from the illumination source 116 into two or more diffraction orders, where the illumination lobes 302 are formed from at least some of the diffraction orders. Efficient generation of multiple illumination lobes through controlled diffraction is generally described in U.S. Pat. No. 11,118,903 issued on Sep. 14, 2021 titled Efficient Illumination Shaping for Scatterometry Overlay, which is incorporated herein by reference in its entirety.

By way of another example, illumination 118 from the illumination source may be split and directed to different portions of the illumination pupil plane 132 using free-space (e.g., bulk) optics.

Figure 1C:
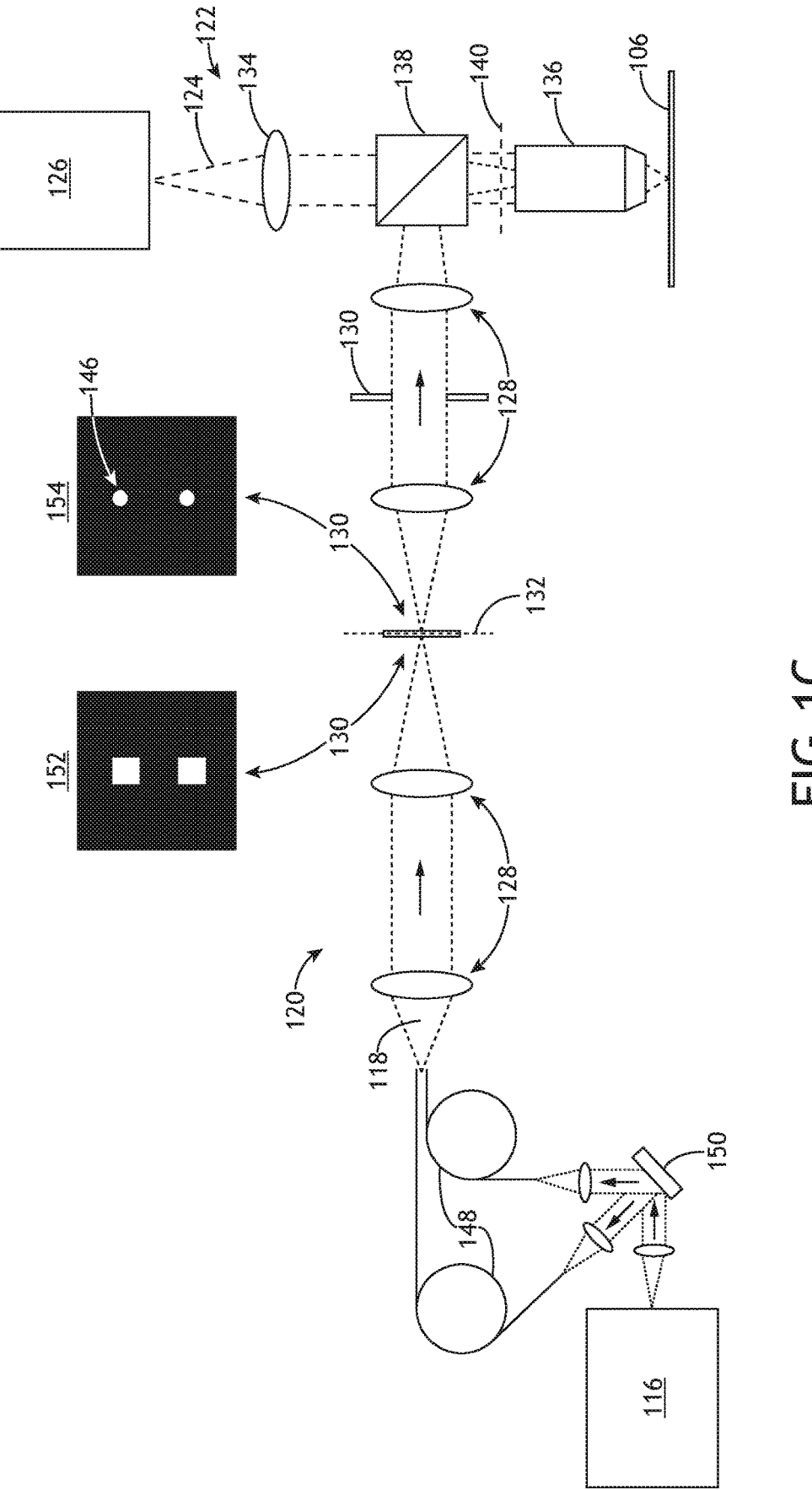
FIG. 1C is a simplified schematic of the overlay metrology tool where illumination from an illumination source is directed to any combination of optical fibers to provide multiple illumination lobes, in accordance with one or more embodiments of the present disclosure.

By way of another example, illumination 118 from the illumination source 116 may be split and directed into one or more optical fibers having output faces in the illumination pupil plane 132 such that light output from each optical fiber corresponds to an illumination lobe 302. As an illustration, FIG. 1C is a simplified schematic of the overlay metrology tool 102 where illumination 118 from an illumination source 116 is directed to any combination of optical fibers 148 to provide multiple illumination lobes 302, in accordance with one or more embodiments of the present disclosure. For example, FIG. 1C depicts an adjustable optical element 150 to selectively direct at least a portion of the illumination 118 into one or more of the optical fibers 148, where the output faces of the optical fibers 148 are imaged to the illumination pupil plane 132. The adjustable optical element 150 may include any combination of one or more elements suitable for directing all or portions of the illumination 118 into selected optical fibers 148 to form a selected illumination distribution such as, but not limited to, galvo mirrors, micro-electro-mechanical systems (MEMS) devices, acousto-optic deflectors, or the like.

As an illustration, the inset 152 depicts a dipole illumination distribution corresponding to images of the output faces of the optical fibers 148. Further, apertures may be used to further modify the size or shape of the associated illumination lobes 302. In FIG. 1C, the inset 154 depicts a spatially filtered illumination profile in which the illumination lobes 302 are filtered to circular shapes using apertures.

It is further contemplated herein that the illumination lobes 302 associated with any illumination distribution may be directed to an overlay target 104 simultaneously, sequentially, or in any combination. Taking the illumination distribution of FIG. 5A as a non-limiting example, in some embodiments, all four illumination lobes 302 may be directed to the overlay target 104 simultaneously. In this configuration, a single bright-field image of the overlay target 104 may capture all associated cells 202 with grating structures 108 along any direction. Accordingly, such a configuration may beneficially provide a high throughput.

As another example based on the illumination distribution of FIG. 5A, in some embodiments, multiple images of the overlay target 104 are sequentially generated based on sequential illumination with different illumination lobes 302. For example, separate images may be captured based on each illumination lobe 302. By way of another example, a first image of the overlay target 104 may be generated based on illumination with one illumination lobe 302 along the horizontal direction and one illumination lobe 302 along the vertical direction. Subsequently, a second image of the overlay target 104 may be generated based on illumination with the other illumination lobe 302 along the horizontal direction and the other illumination lobe 302 along the vertical direction. In this configuration, the contrast loss with defocus of the sample 106 may be minimized since particular images of grating structures 108 along each direction are formed by only two collected diffraction orders (e.g., a 0-order diffraction lobe 410 and a single first-order diffraction lobe). The overlay along any measurement direction may then be calculated from the spatial phase of the separate images of the corresponding grating structures 108. The spatial phase of the grating structures 108 in an image generated by a single illumination lobe 302 is not impacted by the intensity of the illumination lobe 302, so relative intensity differences between pairs of illumination lobes 302 do not impact overlay calculations in this configuration. Further, since each of the separate images in this configuration includes only one first-order diffraction lobe, any differences in intensity between the +1 order diffraction lobes 412 and the −1 order diffraction lobes 414 do not impact the overlay calculation. As a result, an overlay measurement based on sequential imaging with multiple opposing illumination lobes 302 may provide a more robust overlay measurement than an overlay measurement based on simultaneous imaging of the same distribution of illumination lobes 302, but with a reduced throughput associated with the generation of multiple images. In this way, the selection between simultaneous or sequential imaging may represent a balance between performance tradeoffs.

Further, sequential imaging may be implemented using any technique known in the art. For example, apertures forming the illumination lobes 302 may be sequentially modify or inserted. By way of another example, illumination 118 directed to separate portions of the illumination pupil plane 132 (e.g., through fibers, free-space optics, or the like) may be sequentially directed along the respective paths using any combination of optical elements such as, but not limited to, shutters, galvos, MEMS devices, or acousto-optic deflectors (e.g., as depicted in FIG. 1C).

Referring now to FIG. 14, FIG. 14 is a flow diagram illustrating steps performed in a method 1400 for overlay metrology based on bright-field imaging with oblique illumination and collection of selected diffraction orders, in accordance with one or more embodiments of the present disclosure. Applicant notes that the embodiments and enabling technologies described previously herein in the context of the overlay metrology system 100 should be interpreted to extend to the method 1400. It is further noted, however, that the method 1400 is not limited to the architecture of the overlay metrology system 100.

In some embodiments, the method 1400 includes a step 1402 of capturing one or more images of the overlay target using an overlay metrology tool, where the overlay metrology tool illuminates the overlay target with two or more oblique illumination lobes distributed among one or more illumination distributions such that for each measurement direction, collected diffraction orders exclusively include a 0-order diffraction lobe and a single first-order diffraction lobe from at least one of the two or more illumination lobes. For example, the step 1404 may include, but is not limited to, imaging the overlay target based on any of the illumination distributions and associated collection profiles illustrated in FIGS. 3A-8C.

In some embodiments, the method 1400 includes a step 1404 of generating one or more overlay measurements for the overlay target associated with the one or more measurement directions based on the one or more images. It is contemplated herein that the method 1400 may be applied to any type of overlay target known in the art and may provide an overlay measurement associated with any two lithographic exposures. For example, the overlay target may include patterned features on two or more layers such that an overlay measurement in step 1404 corresponds to an overlay measurement associated with the two or more layers. By way of another example, the overlay target may include patterned features on a common layer, but generated by two or more lithographic exposures (e.g., in a double printing process, or the like). In this way, the overlay measurement in step 1404 may be associated with the associated exposures.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly inter-actable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
an overlay metrology tool configured to implement a metrology recipe for measurement of an overlay target on a sample, the overlay target associated with the metrology recipe including one or more grating structures with patterned features distributed along one or more measurement directions, wherein the overlay metrology tool comprises:
an objective lens;
an illumination pathway including one or more illumination optics to illuminate the overlay target with two or more oblique illumination lobes distributed among one or more illumination distributions when implementing the metrology recipe, wherein the two or more oblique illumination lobes form at least one of a rotated dipole illumination distribution or a rotated quadrupole illumination distribution oriented at a non-orthogonal angle to the one or more measurement directions, wherein the one or more illumination distributions provide that, for each of the one or more measurement directions, only a 0-order diffraction lobe and a single first-order diffraction lobe are collected by the objective lens from any particular one of the two or more oblique illumination lobes; and
a collection pathway including one or more collection optics to image the overlay target on one or more detectors based on light from the overlay target collected by the objective lens when implementing the metrology recipe; and
a controller communicatively coupled to at least the one or more detectors, the controller including one or more processors configured to execute program instructions causing the one or more processors to:
receive one or more bright-field images of the overlay target from the one or more detectors based on the one or more illumination distributions, wherein each of the one or more bright-field images is generated exclusively based on the 0-order diffraction lobe and the single first-order diffraction lobe from at least one of the two or more oblique illumination lobes collected by the objective lens in accordance with the metrology recipe; and
generate one or more overlay measurements for the overlay target associated with the one or more measurement directions based on the one or more bright-field images.

2. The overlay metrology system of claim 1, wherein the metrology recipe defines at least one of pitches of the one or more grating structures in the overlay target along the one or more measurement directions or wavelengths of the two or more oblique illumination lobes in the one or more illumination distributions to provide that, for each of the one or more measurement directions, only a 0-order diffraction lobe and a single first-order diffraction lobe are collected by the objective lens from any particular one of the two or more oblique illumination lobes.

3. The overlay metrology system of claim 1, wherein the one or more grating structures include a first set of grating structures associated with a first lithographic exposure and a second set of grating structures associated with a second lithographic exposure, wherein the one or more overlay measurements correspond to overlay measurements between the first and the second lithographic exposures.

4. The overlay metrology system of claim 3, wherein the first set of grating structures is on a first layer of the sample, wherein the second set of grating structures is on a second layer of the sample.

5. The overlay metrology system of claim 3, wherein the first and second sets of grating structures are on a common layer of the sample.

6. The overlay metrology system of claim 1, wherein the overlay target includes one or more cells with a portion of the one or more grating structures having periodicity along a first of the one or more measurement directions, wherein the overlay target further includes one or more cells with a portion of the one or more grating structures having periodicity along a second of the one or more measurement directions.

7. The overlay metrology system of claim 1, wherein the overlay target comprises:
at least one of an advanced imaging metrology (AIM) target, a robust AIM target or a triple AIM target.

8. The overlay metrology system of claim 1, wherein at least one of the two or more oblique illumination lobes is shaped as a circle.

9. The overlay metrology system of claim 1, wherein at least one of the two or more oblique illumination lobes is shaped as an ellipse.

10. The overlay metrology system of claim 1, wherein at least one of the two or more oblique illumination lobes is shaped as a geometric lens.

11. The overlay metrology system of claim 1, wherein the two or more oblique illumination lobes comprise:
two oblique illumination lobes to form a dipole illumination distribution oriented along one of the one or more measurement directions.

12. The overlay metrology system of claim 1, wherein the two or more oblique illumination lobes comprise:
two oblique illumination lobes to form a rotated dipole illumination distribution oriented at a non-orthogonal angle to the one or more measurement directions.

13. The overlay metrology system of claim 1, wherein the one or more measurement directions comprise:
two measurement directions, wherein the two or more oblique illumination lobes comprise:
four oblique illumination lobes to form a quadrupole illumination distribution oriented along the two measurement directions.

14. The overlay metrology system of claim 1, wherein the one or more measurement directions comprise:
two measurement directions, wherein the two or more oblique illumination lobes comprise:

four oblique illumination lobes to form a rotated quadrupole illumination distribution oriented at a non-orthogonal angle to the two measurement directions.

15. The overlay metrology system of claim 1, wherein the one or more illumination distributions comprise:

a single illumination distribution.

16. The overlay metrology system of claim 1, wherein the one or more illumination distributions comprise:

two or more illumination distributions generated sequentially.

17. An overlay metrology system comprising:

a controller communicatively coupled with an overlay metrology tool, wherein the overlay metrology tool is configured to implement a metrology recipe for measurement of an overlay target on a sample, the overlay target associated with the metrology recipe including one or more grating structures with patterned features distributed along one or more measurement directions, wherein the overlay metrology tool comprises:

an objective lens;

an illumination pathway including one or more illumination optics to illuminate the overlay target with two or more oblique illumination lobes distributed among one or more illumination distributions when implementing the metrology recipe, wherein the two or more oblique illumination lobes form at least one of a rotated dipole illumination distribution or a rotated quadrupole illumination distribution oriented at a non-orthogonal angle to the one or more measurement directions, wherein the one or more illumination distributions provide that, for each of the one or more measurement directions, only a 0-order diffraction lobe and a single first-order diffraction lobe are collected by the objective lens from any particular one of the two or more oblique illumination lobes; and a collection pathway including one or more collection optics to image the overlay target on one or more detectors based on light from the overlay target collected by the objective lens when implementing the metrology recipe;

wherein the controller includes one or more processors configured to execute program instructions causing the one or more processors to:

receive one or more bright-field images of the overlay target from the one or more detectors based on the one or more illumination distributions, wherein each of the one or more bright-field images is generated exclusively based on the 0-order diffraction lobe and the single first-order diffraction lobe from at least one of the two or more oblique illumination lobes collected by the objective lens in accordance with the metrology recipe; and generate one or more overlay measurements for the overlay target associated with the one or more measurement directions based on the one or more bright-field images.

18. The overlay metrology system of claim 17, wherein the metrology recipe defines at least one of pitches of the one or more grating structures in the overlay target along the one or more measurement directions or wavelengths of the two or more oblique illumination lobes in the one or more illumination distributions to provide that, for each of the one or more measurement directions, only a 0-order diffraction lobe and a single first-order diffraction lobe are collected by the objective lens from any particular one of the two or more oblique illumination lobes.

19. The overlay metrology system of claim 17, wherein the one or more grating structures include a first set of grating structures associated with a first lithographic exposure and a second set of grating structures associated with a second lithographic exposure, wherein the one or more overlay measurements correspond to overlay measurements between the first and second lithographic exposures.

20. The overlay metrology system of claim 19, wherein the first set of grating structures is on a first layer of the sample, wherein the second set of grating structures is on a second layer of the sample.

21. The overlay metrology system of claim 19, wherein the first and second sets of grating structures are on a common layer of the sample.

22. The overlay metrology system of claim 17, wherein the overlay target includes one or more cells with a portion of the one or more grating structures having periodicity along a first of the one or more measurement directions, wherein the overlay target further includes one or more cells with a portion of the one or more grating structures having periodicity along a second of the one or more measurement directions.

23. The overlay metrology system of claim 17, wherein the overlay target comprises:

at least one of an advanced imaging metrology (AIM) target, a robust AIM target or a triple AIM target.

24. The overlay metrology system of claim 17, wherein at least one of the two or more oblique illumination lobes is shaped as a circle.

25. The overlay metrology system of claim 17, wherein at least one of the two or more oblique illumination lobes is shaped as an ellipse.

26. The overlay metrology system of claim 17, wherein at least one of the two or more oblique illumination lobes is shaped as a geometric lens.

27. The overlay metrology system of claim 17, wherein the two or more oblique illumination lobes comprise:

two oblique illumination lobes to form a dipole illumination distribution oriented along one of the one or more measurement directions.

28. The overlay metrology system of claim 17, wherein the two or more oblique illumination lobes comprise:

two oblique illumination lobes to form a rotated dipole illumination distribution oriented at a non-orthogonal angle to the one or more measurement directions.

29. The overlay metrology system of claim 17, wherein the one or more measurement directions comprise:

two measurement directions, wherein the two or more oblique illumination lobes comprise:

four oblique illumination lobes to form a quadrupole illumination distribution oriented along the two measurement directions.

30. The overlay metrology system of claim 17, wherein the one or more measurement directions comprise:

two measurement directions, wherein the two or more oblique illumination lobes comprise:

four oblique illumination lobes to form a rotated quadrupole illumination distribution oriented at a non-orthogonal angle to the two measurement directions.

31. The overlay metrology system of claim 17, wherein the one or more illumination distributions comprise:

a single illumination distribution.

32. The overlay metrology system of claim 17, wherein the one or more illumination distributions comprise:

two or more illumination distributions generated sequentially.

33. An overlay method comprising:

capturing one or more bright-field images of an overlay target using an overlay metrology tool, wherein the overlay metrology tool is configured to implement a metrology recipe for measurement of the overlay target on a sample, the overlay target associated with the metrology recipe including one or more grating structures with patterned features distributed along one or more measurement directions, wherein the overlay metrology tool comprises:

an objective lens;

an illumination pathway including one or more illumination optics to illuminate the overlay target with two or more oblique illumination lobes distributed among one or more illumination distributions when implementing the metrology recipe, wherein the two or more oblique illumination lobes form at least one of a rotated dipole illumination distribution or a rotated quadrupole illumination distribution oriented at a non-orthogonal angle to the one or more measurement directions, wherein the one or more illumination distributions provide that, for each of the one or more measurement directions, only a 0-order diffraction lobe and a single first-order diffraction lobe are collected by the objective lens from any particular one of the two or more oblique illumination lobes; and a collection pathway including one or more collection optics to image the overlay target on one or more detectors based on light from the overlay target collected by the objective lens in response to the one or more illumination distributions, wherein each of the one or more bright-field images is generated exclusively based on the 0-order diffraction lobe and the single first-order diffraction lobe from at least one of the two or more oblique illumination lobes collected by the objective lens in accordance with the metrology recipe; and generating one or more overlay measurements for the overlay target associated with the one or more measurement directions based on the one or more bright-field images.

* * * * *